(12) United States Patent
Hamaguchi

(10) Patent No.: US 9,261,565 B2
(45) Date of Patent: Feb. 16, 2016

(54) METHOD OF TESTING SECONDARY BATTERY

(75) Inventor: Hiroshi Hamaguchi, Toyota (JP)

(73) Assignee: Toyota Jidosha Kabushiki Kaisha, Toyota-shi, Aichi (JP)

( * ) Notice: Subject to any disclaimer, the term of this patent is extended or adjusted under 35 U.S.C. 154(b) by 149 days.

(21) Appl. No.: 14/343,496

(22) PCT Filed: Sep. 9, 2011

(86) PCT No.: PCT/JP2011/070634
§ 371 (c)(1),
(2), (4) Date: Mar. 7, 2014

(87) PCT Pub. No.: WO2013/035202
PCT Pub. Date: Mar. 14, 2013

(65) Prior Publication Data
US 2014/0210480 A1   Jul. 31, 2014

(51) Int. Cl.
G01N 27/416 (2006.01)
H01M 10/48 (2006.01)
G01R 31/36 (2006.01)
H01M 10/0587 (2010.01)
H01M 10/0525 (2010.01)
H01M 10/44 (2006.01)
H01M 10/42 (2006.01)

(52) U.S. Cl.
CPC ....... *G01R 31/3627* (2013.01); *H01M 10/0525* (2013.01); *H01M 10/0587* (2013.01); *H01M 10/446* (2013.01); *H01M 10/448* (2013.01); *H01M 2010/4292* (2013.01); *Y02E 60/122* (2013.01)

(58) Field of Classification Search
CPC .................................................. G01R 31/3627
USPC .............................................. 324/426; 429/61
See application file for complete search history.

(56) References Cited

U.S. PATENT DOCUMENTS

| | | | | |
|---|---|---|---|---|
| 8,653,793 B2 * | 2/2014 | Ueki | .................... | B60L 11/1861 320/132 |
| 2008/0265841 A1 | 10/2008 | Kim | | |
| 2010/0285349 A1 * | 11/2010 | Goto | .................... | H01M 10/484 429/156 |
| 2011/0143183 A1 * | 6/2011 | Matsumoto | .......... | H01M 2/1626 429/144 |
| 2011/0187312 A1 * | 8/2011 | Yamamoto | .......... | H01M 10/425 320/101 |
| 2012/0169288 A1 * | 7/2012 | Ueki | .................... | B60L 11/1861 320/134 |
| 2012/0176097 A1 * | 7/2012 | Takezawa | ............. | H01M 4/386 320/134 |

(Continued)

FOREIGN PATENT DOCUMENTS

| | | |
|---|---|---|
| CN | 101299059 A | 11/2008 |
| EP | 1 158 306 | 11/2001 |
| JP | 2003-036891 A | 2/2003 |

(Continued)

*Primary Examiner* — M'Baye Diao
(74) *Attorney, Agent, or Firm* — Finnegan, Henderson, Farabow, Garrett & Dunner, LLP

(57) ABSTRACT

A method of testing a secondary battery includes step A of charging the secondary battery to a predetermined charge voltage, step B of setting aside the secondary battery for a predetermined time (tb) after the step A, step C of discharging the secondary battery to a predetermined discharge voltage after the step B, and step D of detecting a battery voltage increase for a preset time (t2) after a predetermined time (t1) has elapsed after the step C. This method of testing a secondary battery can evaluate a measurement of how much the negative electrode active material layer covers the positive electrode active material layer based on the battery voltage increase detected in the step D.

20 Claims, 17 Drawing Sheets

(56) References Cited

U.S. PATENT DOCUMENTS

2013/0309569 A1* 11/2013 Tsujiko .................. H01M 4/70
                                                         429/211

FOREIGN PATENT DOCUMENTS

| | | |
|---|---|---|
| JP | 3470714 B | 9/2003 |
| JP | 2003-297412 | 10/2003 |
| JP | 2004-30939 | 1/2004 |
| JP | 2004-71173 | 3/2004 |
| JP | 2004-361253 A | 12/2004 |
| JP | 2005-190913 | 7/2005 |
| JP | 2006-86060 | 3/2006 |
| WO | WO 2005/039013 | 4/2005 |

* cited by examiner

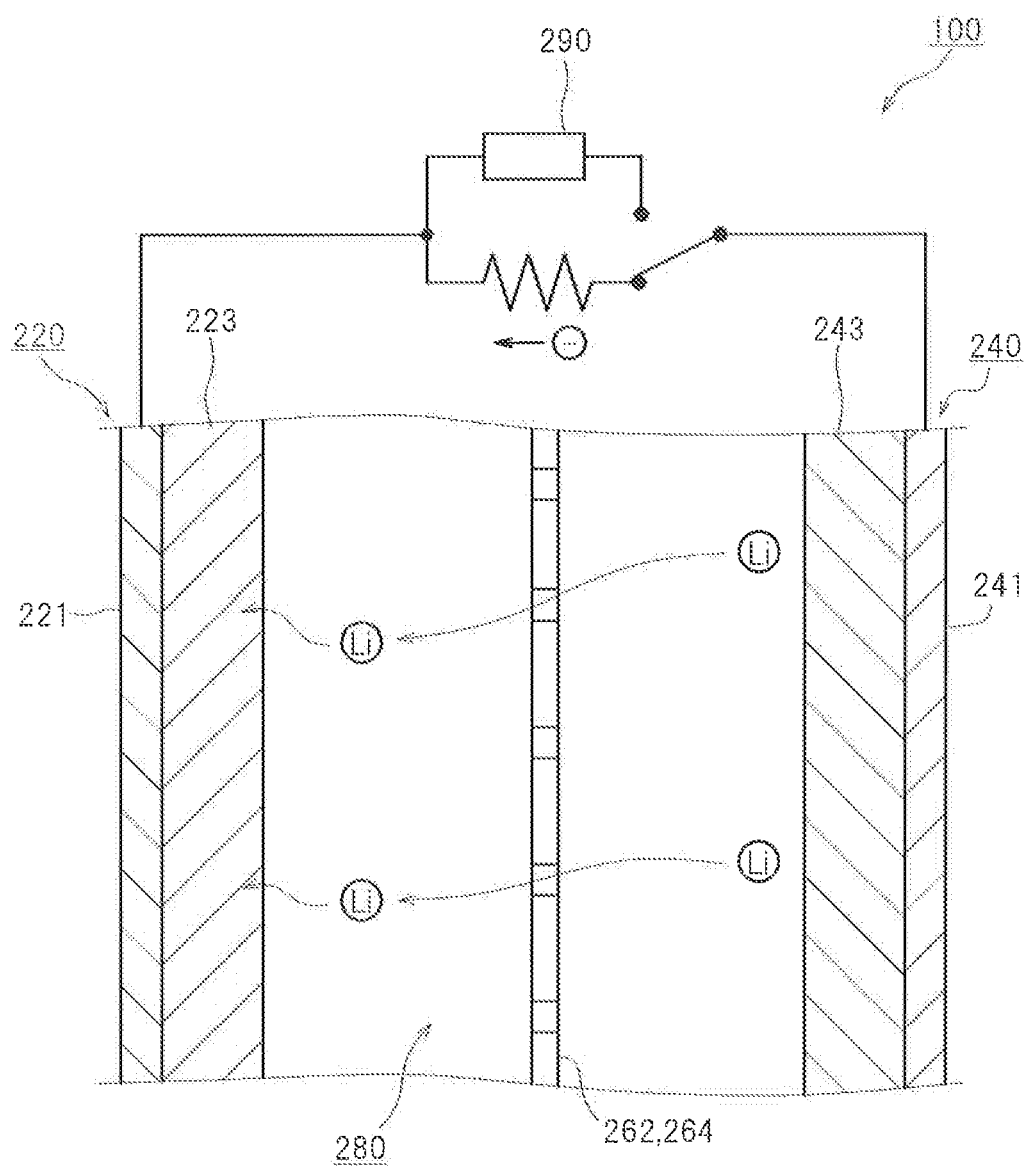

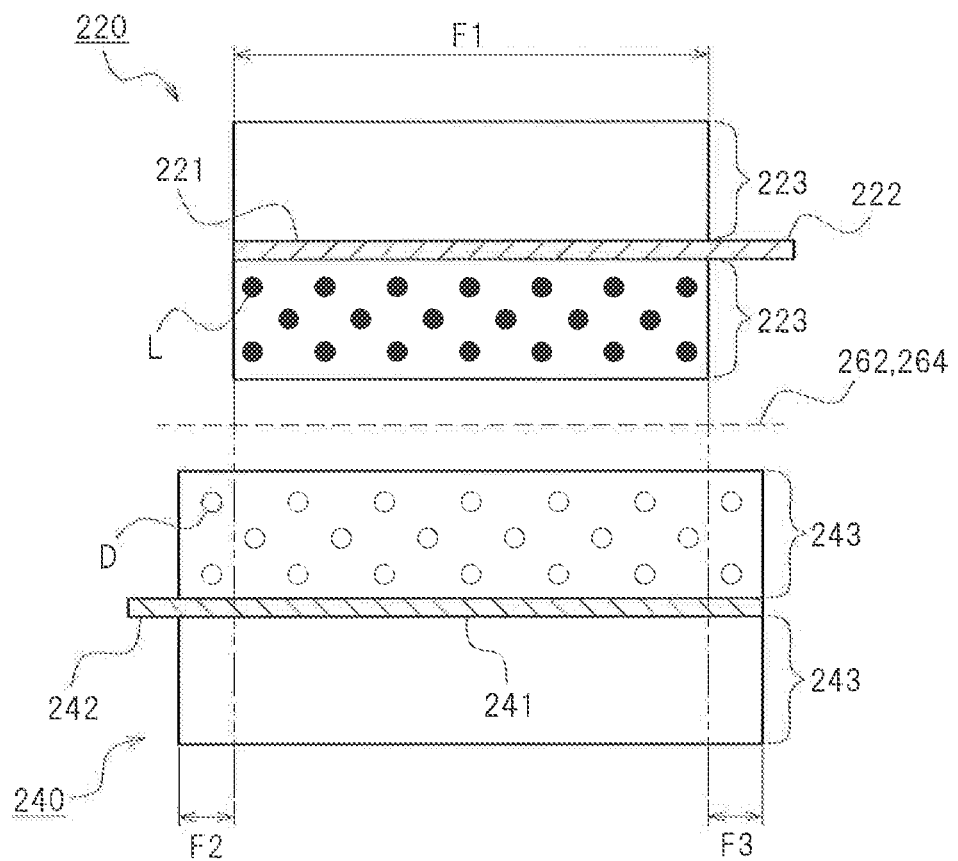

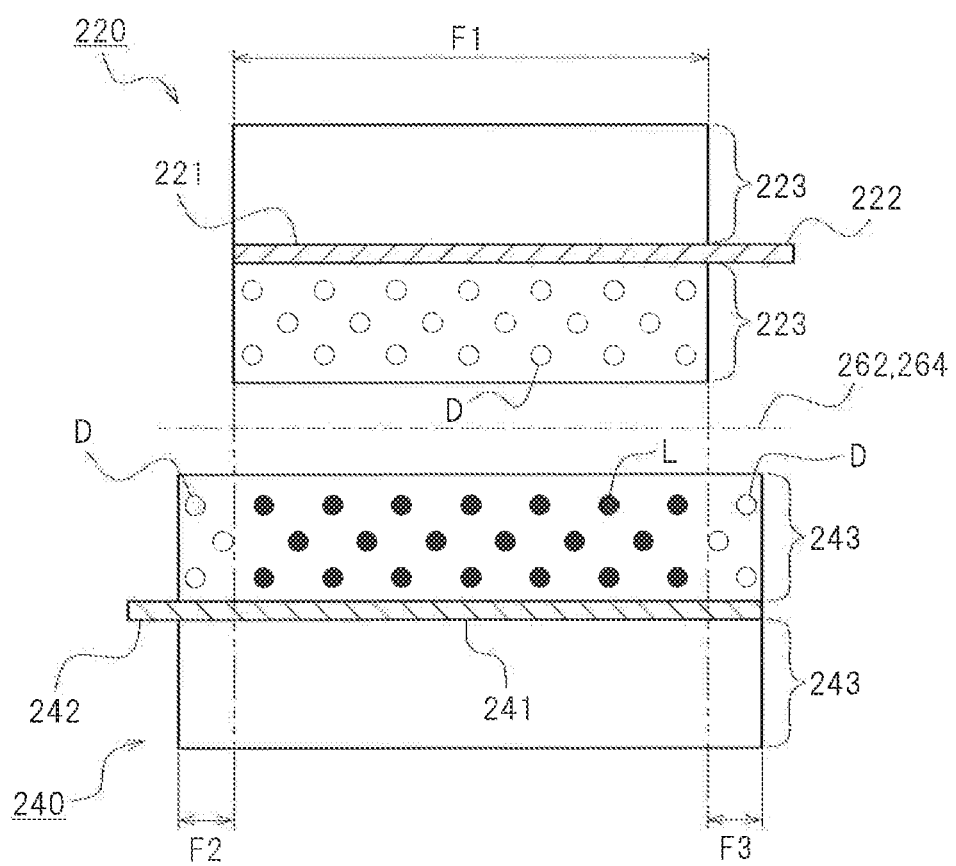

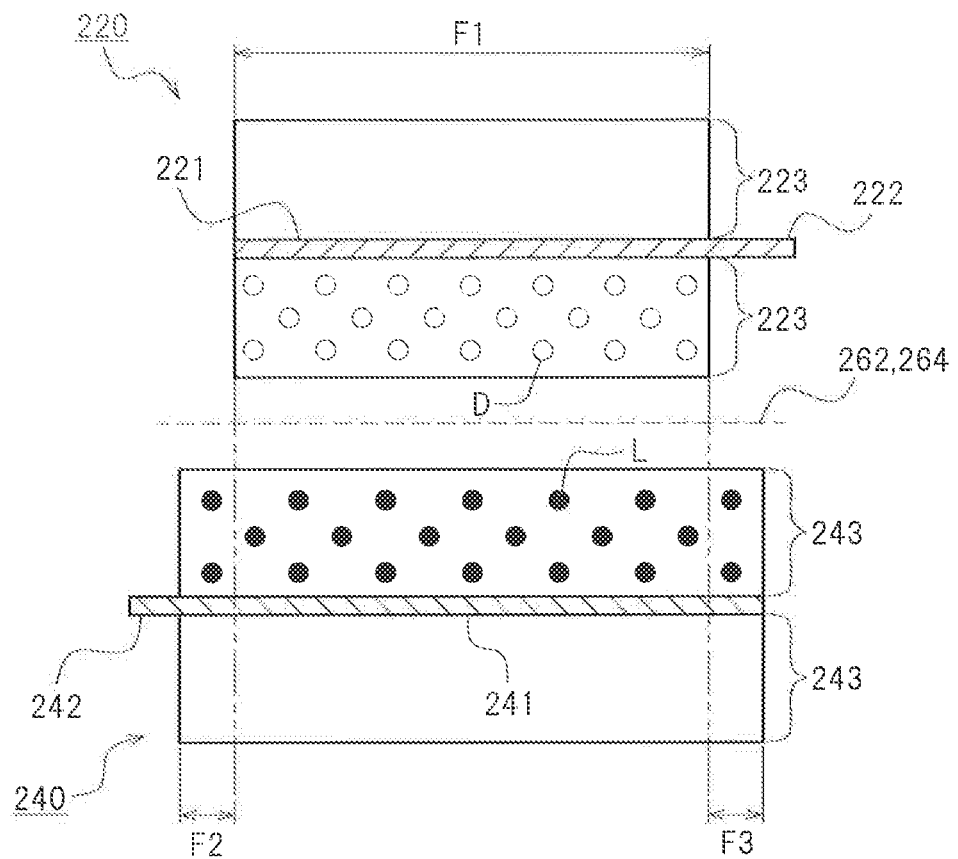

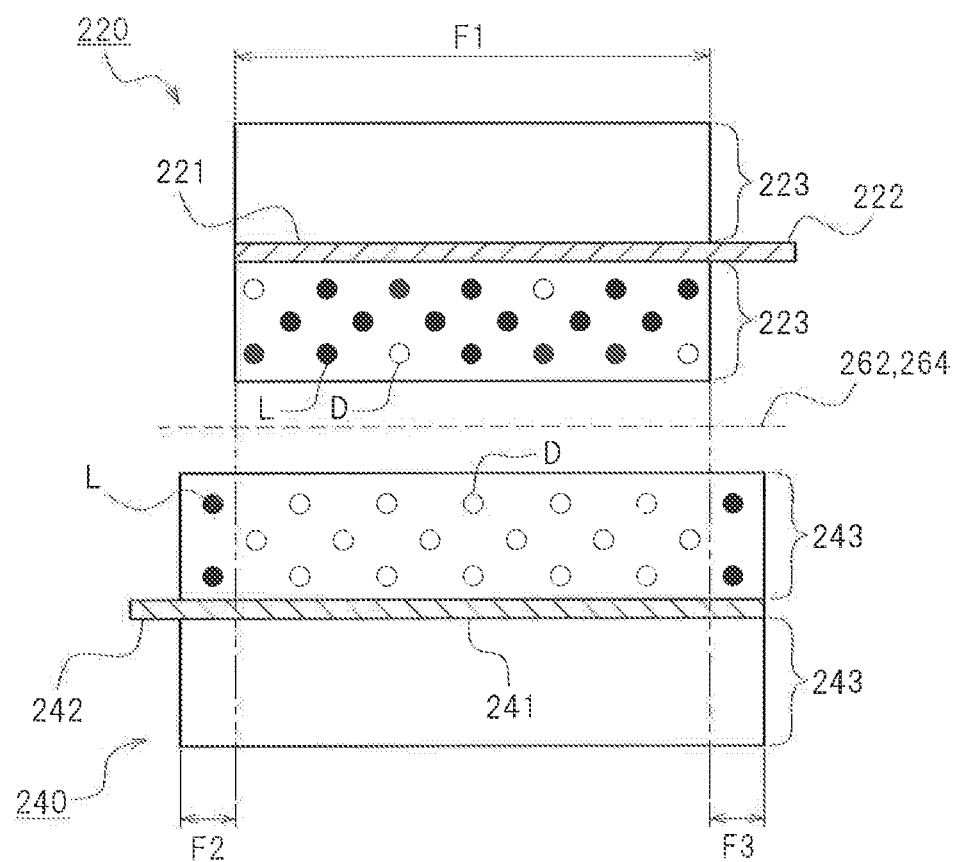

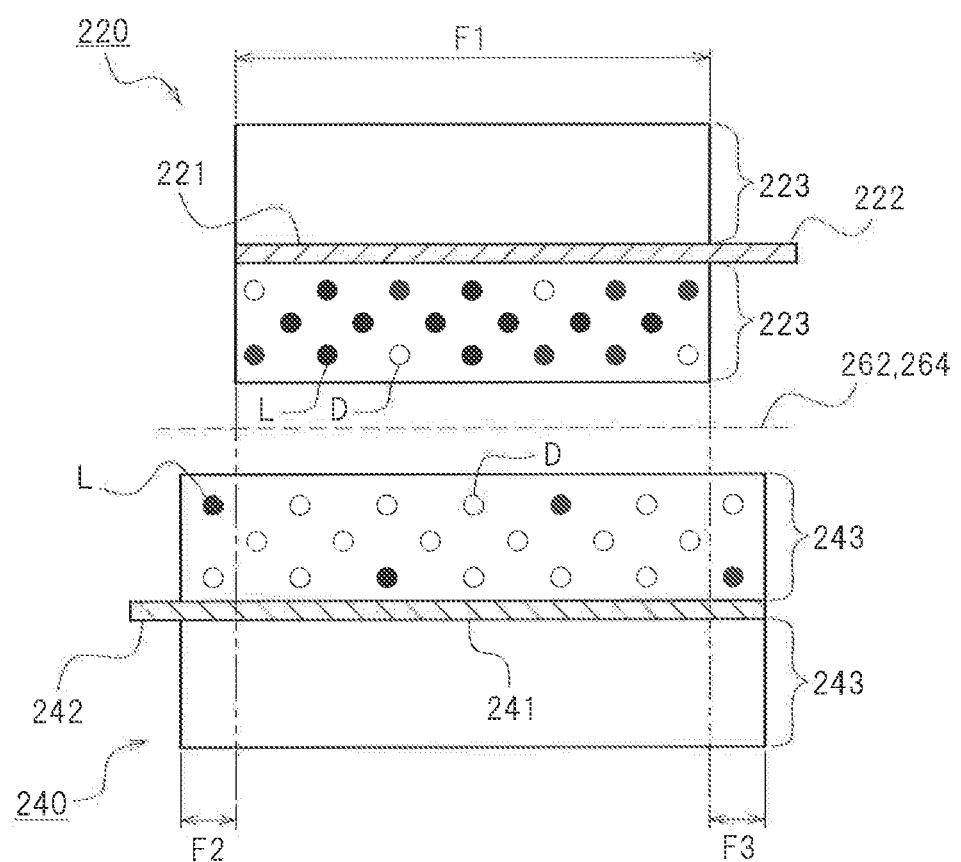

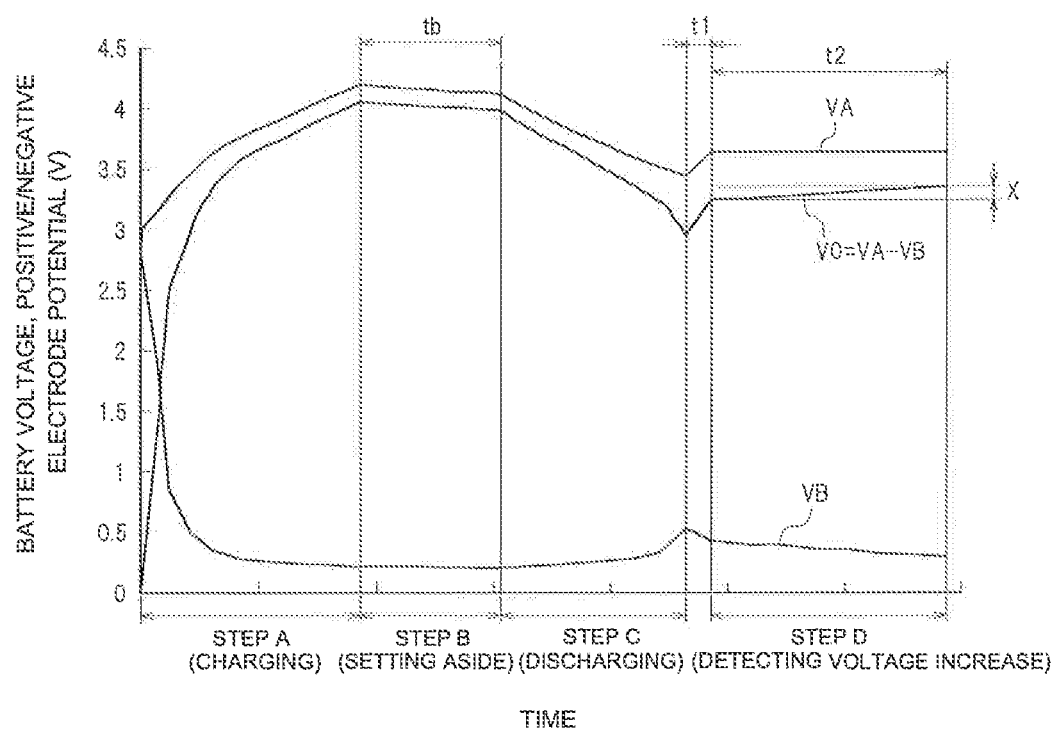

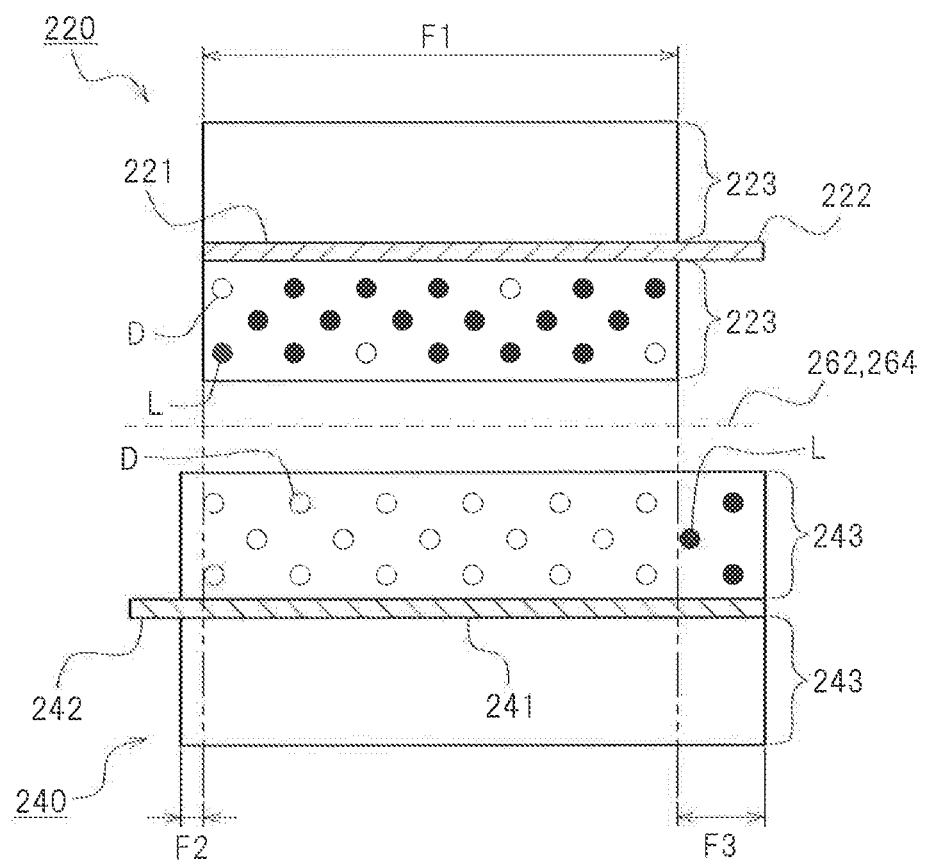

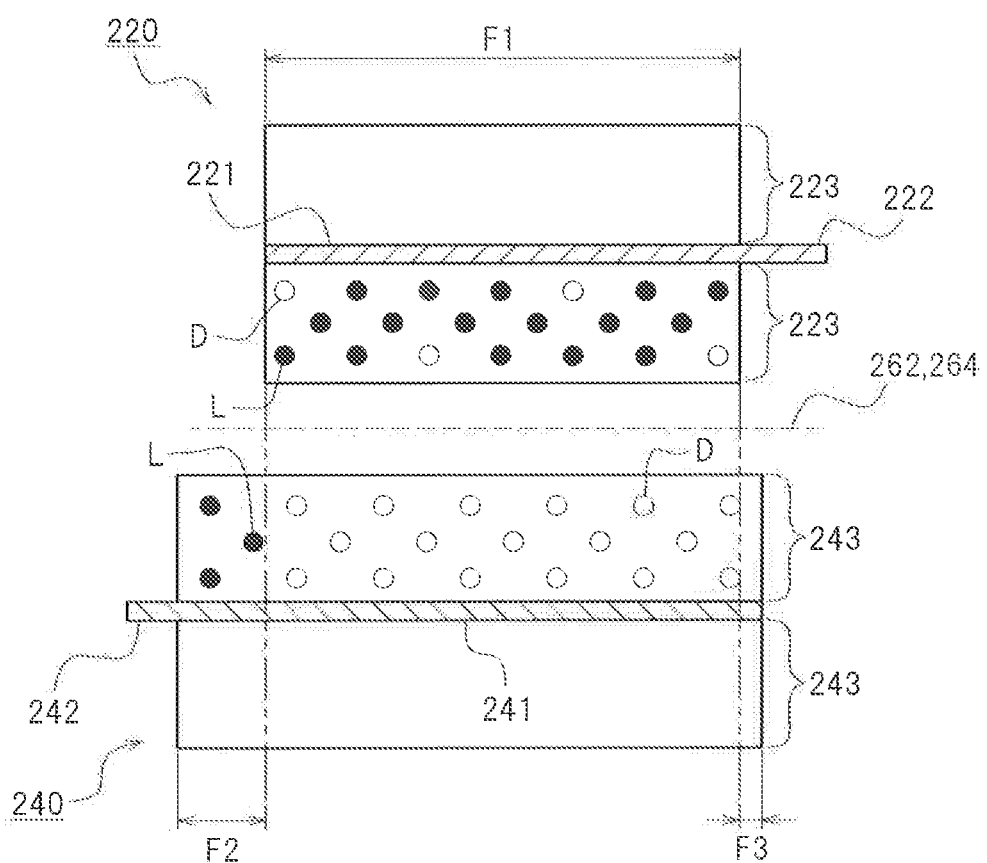

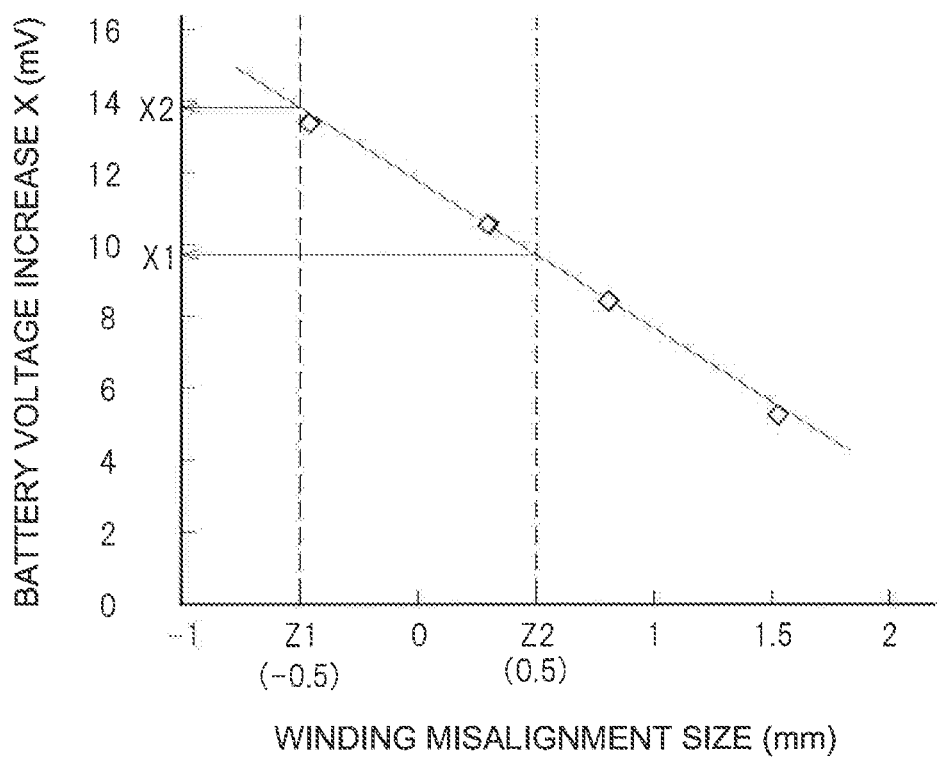

METHOD OF TESTING SECONDARY BATTERY

CROSS-REFERENCE TO RELATED APPLICATIONS

This application is a national phase application of International Application No. PCT/JP2011/070634, filed Sep. 9, 2011, the content of which is incorporated herein by reference.

TECHNICAL FIELD

The present invention relates to a method of testing a secondary battery.

In the present description, the term "secondary battery" refers to a rechargeable storage device in general, which encompasses what is called storage batteries, such as lithium secondary batteries (typically lithium-ion secondary batteries) and nickel-metal hydride batteries. In the present description, the term "active material" refers to a substance capable of reversibly absorbing and releasing (typically inserting and deinserting) a chemical species that serves as a charge carrier (e.g., lithium ions in the case of lithium-ion secondary batteries). The term "non-aqueous electrolyte secondary battery" refers to a secondary battery using a non-aqueous electrolyte (such as a non-aqueous electrolyte solution) as its electrolyte (or electrolyte solution).

BACKGROUND ART

In the field of secondary battery, JP 2003-297412 A, for example, discloses a winding apparatus for fabricating an electrode assembly in which a positive electrode sheet and a negative electrode sheet are wound spirally with separators interposed therebetween. As disclosed in this publication, the winding apparatus winds the positive electrode sheet and the negative electrode sheet while correcting misalignment of the electrode sheets so that winding misalignment of the electrode sheets does not occur.

CITATION LIST

Patent Literature

Patent Literature 1: JP 2003-297412 A

SUMMARY OF INVENTION

Technical Problem

Although the positive electrode sheet and the negative electrode sheet are wound together while correcting misalignment therebetween as described above, in reality, winding misalignment inevitably occurs to some degree. Nevertheless, in the field of secondary battery, no method for inspecting such winding misalignment between the positive electrode sheet and the negative electrode sheet has been established. For example, it is possible to measure an actual winding misalignment between the positive electrode sheet and the negative electrode sheet by disassembling the secondary battery and unwinding the wound electrode assembly in which the positive electrode sheet and the negative electrode sheet are spirally wound. However, this method requires disassembling of the secondary battery and considerable time and effort for measuring the winding misalignment. Such a method of testing that accompanies disassembling of the battery may be applicable to a sampling inspection, but it is not suitable for a full inspection.

Solution to Problem

In one embodiment of the present invention, a method of testing a secondary battery relates to a secondary battery including a positive electrode current collector, a positive electrode active material layer retained on the positive electrode current collector, a negative electrode current collector, and a negative electrode active material layer retained on the negative electrode current collector and disposed so as to oppose the positive electrode active material layer, the negative electrode active material layer being wider than the positive electrode active material layer and disposed so as to cover the positive electrode active material layer. The method of testing a secondary battery comprises: step A of charging the secondary battery to a predetermined charge voltage; step B of setting aside the secondary battery for a predetermined time (tb) after the step A; step C of discharging the secondary battery to a predetermined discharge voltage after the step B; and step D of detecting a battery voltage increase for a preset time (t2) after a predetermined time (t1) has elapsed after the step C. This method of testing a secondary battery can evaluate a measurement of how much the negative electrode active material layer covers the positive electrode active material layer based on the battery voltage increase detected in the step D. Moreover, because this method of testing a secondary battery is non-destructive, a full inspection is possible for the measurement of how much the negative electrode active material layer covers the positive electrode active material layer, i.e., for the misalignment between the negative electrode current collector and the positive electrode current collector.

It is preferable that the charging in the step A be, for example, CCCV charging. It is also preferable that the charge voltage in the step A may be set to a voltage 10% or more higher than a lower limit voltage of a predetermined use range of the secondary battery. It is also possible that the charge voltage in the step A may be set to be, for example, equal to or higher than a voltage 10% lower than an upper limit voltage of a predetermined use range of the secondary battery.

It is preferable that the discharging in the step C be, for example, CC discharging. It is preferable that the discharge voltage in the step C be set to, for example, a voltage 5% or more lower than the charge voltage in the step A. It is also possible that the discharge voltage in the step C may be set to a voltage 5% or more higher than a lower limit voltage of a predetermined use range of the secondary battery.

It is preferable that the predetermined time (t1) in the step D be set to, for example, a time necessary to neutralize an electrochemical polarization associated with the discharging. For example, in the step D, it is preferable that the battery voltage increase be detected for a preset time (t2) after at least 3 hours have elapsed after the step C. Also for example, in the step D, it is possible that the battery voltage increase may be detected for at least 5 hours after the predetermined time t2 has elapsed after the step C. In the step B, the time (tb) for setting the secondary battery aside may be set to, for example, at least 24 hours.

The method may further comprise step E of performing a pass-or-fail determination about a measurement of how much the negative electrode active material layer of the secondary battery covers the positive electrode active material layer, by providing a threshold value of the battery voltage increase obtained in the step D. In this case, it is preferable that in the step E, the threshold value be determined based on a relationship between secondary batteries each of whose measurement of how much the negative electrode active material layer covers the positive electrode active material layer is known and the battery voltage increase detected in the step D for each of the secondary batteries. The method may further comprise step F of estimating a measurement of how much the negative electrode active material layer covers the positive electrode active material layer of the secondary battery, based on the battery voltage increase detected in the step D.

Here, an example of the structure of the secondary battery may be such that: the positive electrode current collector is a strip-shaped positive electrode current collector including a positive electrode active material layer formed on both faces thereof; the negative electrode current collector is a strip-shaped negative electrode current collector including a negative electrode active material layer formed on both faces thereof; and the negative electrode active material layer has a width wider than that of the positive electrode active material layer. In this case, the positive electrode current collector and the negative electrode current collector may be stacked and wound together with separators interposed therebetween so that the positive electrode active material layer and the negative electrode active material layer face each other and that the negative electrode active material layer covers the positive electrode active material layer.

The positive electrode current collector may have a portion being devoid of the positive electrode active material layer along one longitudinal side end thereof. The negative electrode current collector may have a portion being devoid of the negative electrode active material layer along one longitudinal side end thereof. In this case, it is desirable that the positive electrode active material layer and the negative electrode active material layer be such that the portion of the positive electrode current collector being devoid of the positive electrode active material layer protrudes from one side end of an opposed region in which the positive electrode active material layer and the negative electrode active material layer are opposed to each other, and the portion of the negative electrode current collector being devoid of the negative electrode active material layer protrudes from the opposite side end to the side end from which the portion of the positive electrode current collector being devoid of the positive electrode active material layer protrudes.

In this case, the method may further comprise step G of estimating a winding misalignment size of the positive electrode active material layer and the negative electrode active material layer of the secondary battery based on the battery voltage increase detected in the step D. The method may further comprise step H of preparing secondary batteries each of whose winding misalignment size of the positive electrode active material layer and the negative electrode active material layer is known, and obtaining a relationship between the winding misalignment size of the positive electrode active material layer and the negative electrode active material layer and the battery voltage increase detected in the step D based on the prepared secondary batteries. In this case, in the step G, for a secondary battery whose winding misalignment size is unknown, the winding misalignment size of the positive electrode active material layer and the negative electrode active material layer of the secondary battery may be estimated from the battery voltage increase detected in the step D, based on the relationship between the winding misalignment size and the battery voltage increase obtained in the step H.

In this case, the method may further comprise step I of performing a pass-or-fail determination about a winding misalignment size of the positive electrode active material layer and the negative electrode active material layer of the secondary battery, by providing a threshold value of the battery voltage increase obtained in the step D.

The secondary battery may be, for example, a non-aqueous electrolyte secondary battery. Also, the secondary battery may be, for example, a lithium-ion secondary battery. When the secondary battery is a lithium-ion secondary battery, it is desirable that the discharge voltage in the step C be set to lower than or equal to 3.1 V. Moreover, in this case, it is desirable that the charge voltage in the step A be set to be equal to or higher than a voltage 5% higher than the discharge voltage in the step C.

BRIEF DESCRIPTION OF DRAWINGS

FIG. 8 is a view schematically illustrating a state of the lithium-ion secondary battery during discharge.

FIG. 9 is a schematic view illustrating the distribution of lithium in the positive electrode active material layer and the negative electrode active material layer in the initial state.

FIG. 10 is a schematic view illustrating the distribution of lithium in the positive electrode active material layer and the negative electrode active material layer at step A.

FIG. 11 is a schematic view illustrating the distribution of lithium in the positive electrode active material layer and the negative electrode active material layer at step B.

FIG. 12 is a schematic view illustrating the distribution of lithium in the positive electrode active material layer and the negative electrode active material layer at step C.

FIG. 13 is a schematic view illustrating the distribution of lithium in the positive electrode active material layer and the negative electrode active material layer at step D.

FIG. 14 is a graph illustrating one example of changes in the positive electrode potential, the negative electrode potential, and the battery voltage from the initial state to steps A through D.

FIG. 15 is a schematic view illustrating the distribution of lithium in the positive electrode active material layer and the negative electrode active material layer at step C, in an embodiment in which the negative electrode active material layer has unopposed regions F2 and F3 and the unopposed region F2, which is at the end where an uncoated portion is provided, is narrower.

FIG. 16 is a schematic view illustrating the distribution of lithium in the positive electrode active material layer and the negative electrode active material layer at step C, in an embodiment in which the negative electrode active material layer has unopposed regions F2 and F3 and the unopposed region F3, which is at the opposite end to the end where an uncoated portion is provided, is narrower.

FIG. 17 is a graph illustrating one example of the relationship between winding misalignment size Z and battery voltage increase X.

DESCRIPTION OF EMBODIMENTS

Hereinbelow, a method of testing a secondary battery according to one embodiment of the present invention will be described.

Here, one example of lithium-ion secondary battery will be described as an example of the structure of the secondary battery that may be used as the test object. Thereafter, the method of testing a secondary battery according to one embodiment of the present invention will be described. It should be noted that although a lithium-ion secondary battery is illustrated herein as an example of the secondary battery used as the test object, the secondary battery used as the test object is not limited to the lithium-ion secondary battery. In addition, the structure of the secondary battery used as the test object is not limited to the structure of the lithium-ion secondary battery illustrated herein. The drawings are depicted schematically and do not necessarily reflect actual objects. The drawings merely show examples, and they do not limit the invention unless otherwise stated.

<<Lithium-Ion Secondary Battery 100>>

Figure 1:
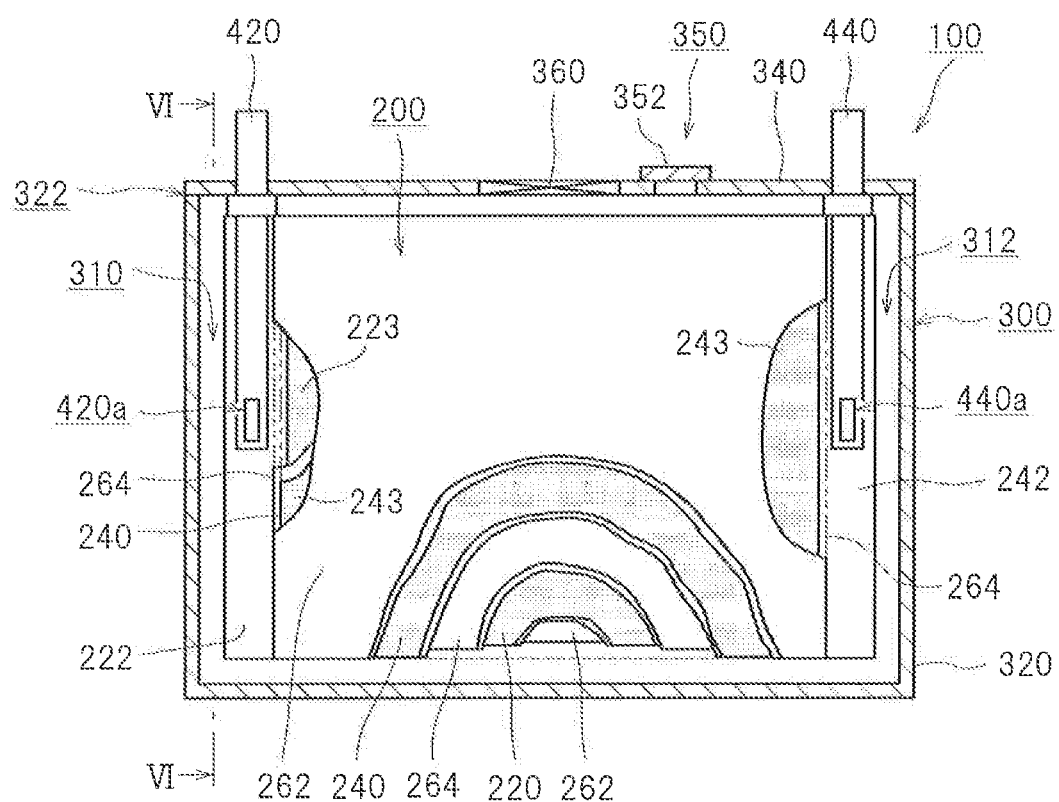
FIG. 1 is a view illustrating one example of the structure of a lithium-ion secondary battery.
Figure 2:
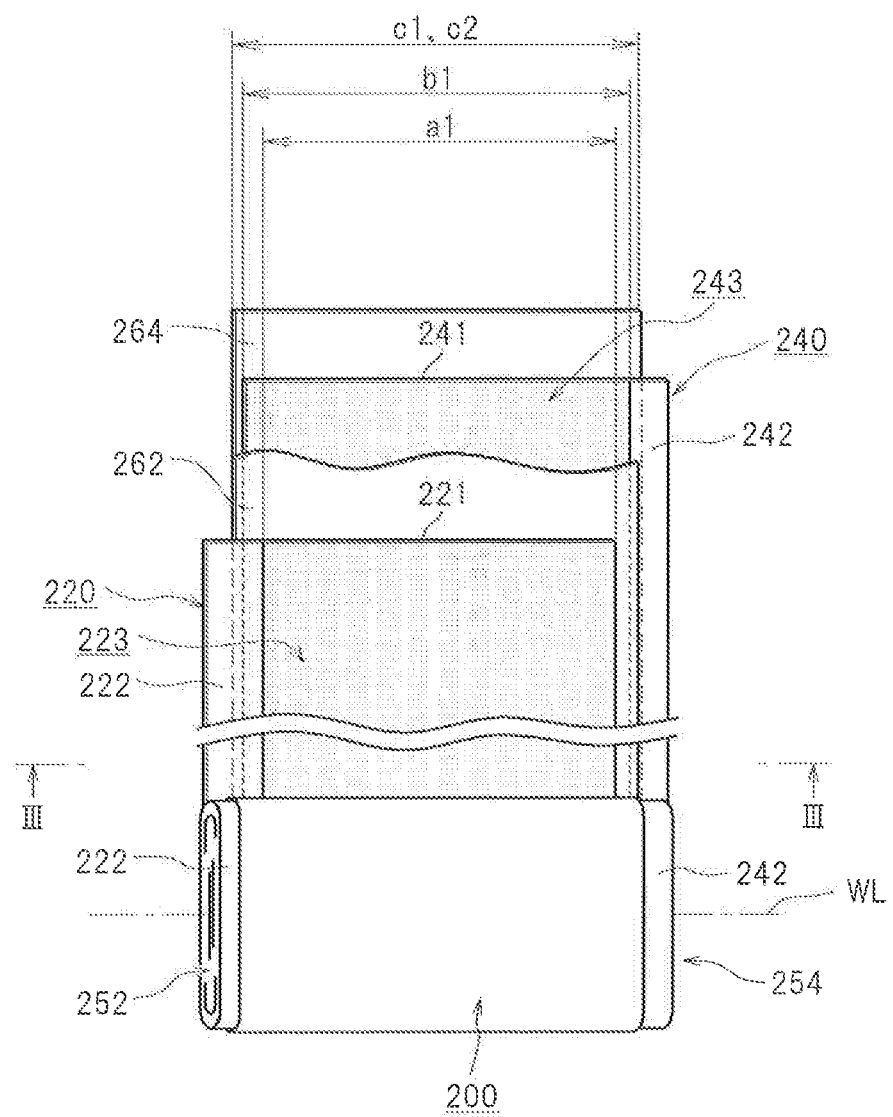
FIG. 2 is a view illustrating a wound electrode assembly of the lithium-ion secondary battery.
Figure 3:
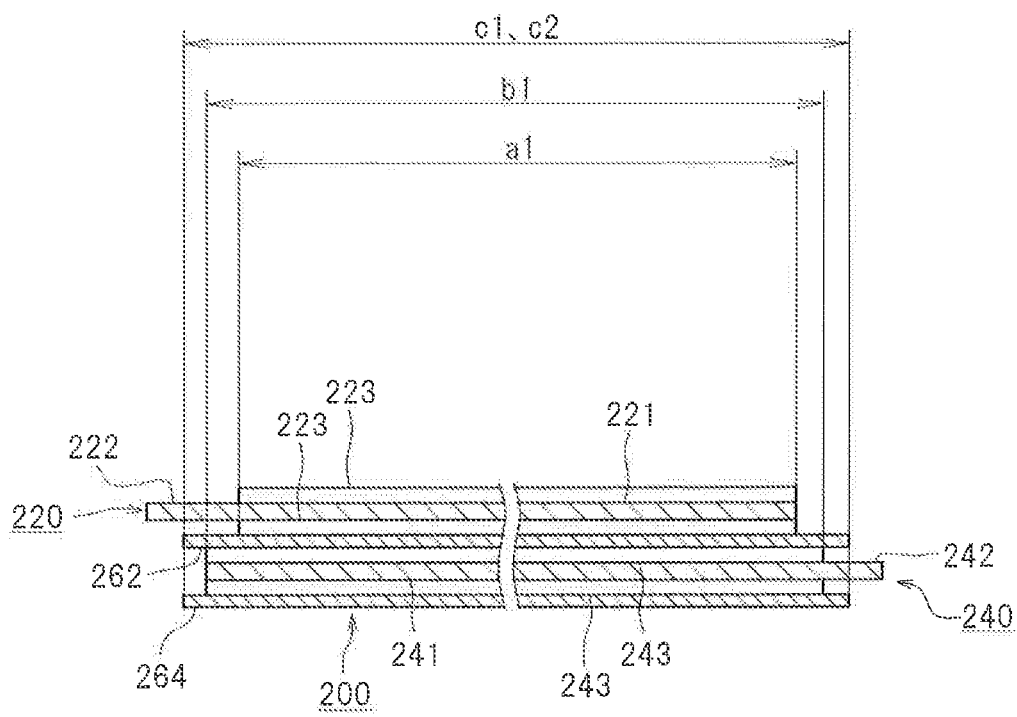
FIG. 3 is a cross-sectional view taken along line III-III in FIG. 2.

FIG. 1 illustrates a lithium-ion secondary battery 100. As illustrated in FIG. 1, the lithium-ion secondary battery 100 has a wound electrode assembly 200 and a battery case 300. FIG. 2 is a view illustrating the wound electrode assembly 200. FIG. 3 shows a cross section taken along line III-III in FIG. 2.

As illustrated in FIG. 2, the wound electrode assembly 200 has a positive electrode sheet 220, a negative electrode sheet 240, and separators 262 and 264. The positive electrode sheet 220, the negative electrode sheet 240, and the separators 262 and 264 are strip-shaped sheets.

<<Positive Electrode Sheet 220>>

The positive electrode sheet 220 has a strip-shaped positive electrode current collector 221 and a positive electrode active material layer 223. A metal foil suitable for the positive electrode may be used preferably for the positive electrode current collector 221. For the positive electrode current collector 221, it is possible to use, for example, a strip-shaped aluminum foil having a predetermined width and a thickness of about 15 μm. An uncoated portion 222 is provided along one lateral-side edge of the positive electrode current collector 221. As illustrated in FIG. 3, the positive electrode active material layer 223 is retained on both faces of the positive electrode current collector 221 except for the uncoated portion 222, which is provided in the positive electrode current collector 221, in the example shown in the figure. The positive electrode active material layer 223 contains a positive electrode active material. The positive electrode mixture layer 223 is formed by coating a positive electrode mixture containing the positive electrode active material onto the positive electrode current collector 221.

<<Positive Electrode Active Material Layer 223 and Positive Electrode Active Material Particles 610>>

Figure 4:
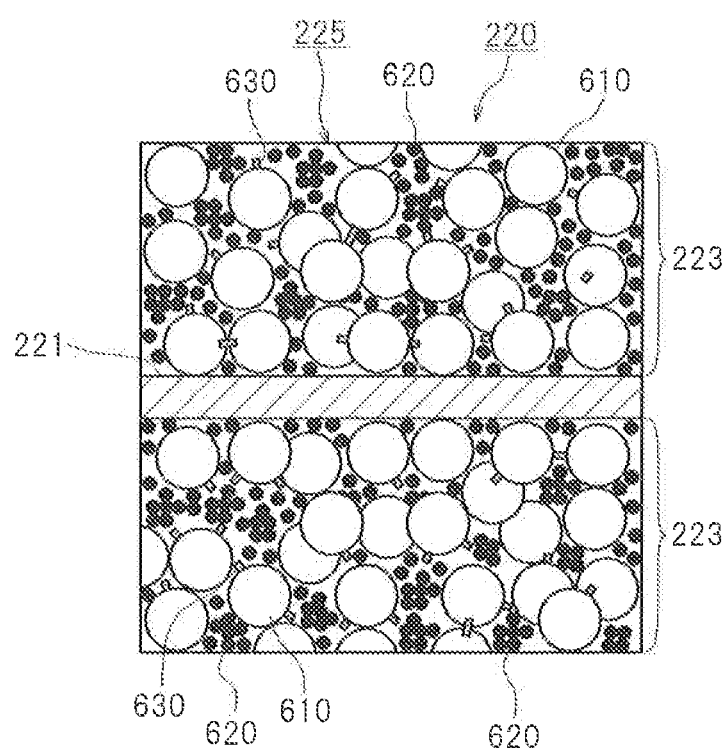
FIG. 4 is a cross-sectional view illustrating the structure of a positive electrode active material layer.

Here, FIG. 4 is a cross-sectional view of the positive electrode sheet 220. In FIG. 4, positive electrode active material particles 610, conductive agent 620, and binder 630 in the positive electrode active material layer 223 are enlarged schematically so that the structure of the positive electrode active material layer 223 can be shown clearly. As illustrated in FIG. 4, the positive electrode active material layer 223 contains the positive electrode active material particles 610, the conductive agent 620, and the binder 630.

Various types of substances that can be used as the positive electrode active material of lithium-ion secondary batteries may be used for the positive electrode active material particles 610. Examples of the positive electrode active material particles 610 include lithium transition metal oxides, such as $LiNiCoMnO_2$ (lithium-nickel-cobalt-manganese composite oxide), $LiNiO_2$ (lithium nickel oxide), $LiCoO_2$ (lithium cobalt oxide), $LiMn_2O_4$ (lithium manganese oxide), and $LiFePO_4$ (lithium iron phosphate). Here, $LiMn_2O_4$ may have, for example, a spinel structure. $LiNiO_2$ and $LiCoO_2$ may have a layered rock-salt structure. $LiFePO_4$ may have, for example, an olivine structure. The $LiFePO_4$ with an olivine structure may have, for example, particles in the range of nanometers. The $LiFePO_4$ with an olivine structure may further be coated with a carbon film.

<<Conductive Agent 620>>

Examples of the conductive agent 620 include carbon materials, such as carbon powder and carbon fiber. As the conductive agent 620, it is possible to use one of the just-mentioned examples of the conductive agents either alone or in combination with another one or more of the examples. Examples of the carbon powder include various types of carbon blacks (such as acetylene black, oil-furnace black, graphitized carbon black, carbon black, graphite, and Ketjen Black) and graphite powder.

<<Binder 630>>

The binder 630 serves to bond the particles of the positive electrode active material particles 610 and the conductive agent 620 contained in the positive electrode active material layer 223 with each other, and to bond these particles with the positive electrode current collector 221. As the binder 630, it is possible to use polymers that can be dissolved or dispersed in the solvent used. For example, for the positive electrode mixture composition using an aqueous solvent, it is preferable to use water-soluble or water-dispersible polymers, including: cellulose-based polymers (such as carboxymethylcellulose (CMC) and hydroxypropyl methyl cellulose (HPMC)); fluoropolymers (such as polyvinyl alcohol (PVA), polytetrafluoroethylene (PTFE), and tetrafluoroethylene-hexafluoropropylene copolymer (FEP)); and rubber materials (such as vinyl acetate copolymer, styrene-butadiene copolymer (SBR), acrylic acid-modified SBR resin (SBR latex)). For the positive electrode mixture composition using a non-aqueous solvent, it is preferable to use polymers (such as polyvinylidene fluoride (PVDF), polyvinylidene chloride (PVDC), and polyacrylonitrile (PAN)).

<<Thickening Agent and Solvent>>

The positive electrode active material layer 223 is formed, for example, in the following manner the positive electrode active material particles 610 and the conductive agent 620 mentioned above are mixed into a paste form (slurry form) in a solvent to prepare a positive electrode mixture, which is then coated onto the positive electrode current collector 221, dried, and pressure-rolled. In this case, either an aqueous solvent or a non-aqueous solvent can be used as the solvent for the positive electrode mixture. A preferable example of the non-aqueous solvent is N-methyl-2-pyrrolidone (NMP). The above-mentioned examples of the polymer materials used as the binder 630 can also be used for the purpose of obtaining the function as an addition agent, such as a thickening agent for the positive electrode mixture, in addition to the function as the binder.

It is preferable that the mass ratio of the positive electrode active material in the entire positive electrode mixture be about 50 wt. % or more (typically from 50 wt. % to 95 wt. %), and generally more preferably from about 70 wt. % to about 95 wt. % (e.g., from 75 wt. % to 90 wt. %). The proportion of the conductive agent in the entire positive electrode mixture may be from about 2 wt. % to about 20 wt. %, and generally preferably from about 2 wt. % to about 15 wt. %. In a composition that uses a binder, the proportion of the binder in the entire positive electrode mixture may be from about 1 wt. % to about 10 wt. %, and generally preferably from about 2 wt. % to about 5 wt. %.

<<Negative Electrode Sheet 240>>

As illustrated in FIG. 2, the negative electrode sheet 240 has a strip-shaped negative electrode current collector 241 and a negative electrode active material layer 243. A metal foil suitable for the negative electrode may be used preferably for the negative electrode current collector 241. A strip-shaped copper foil having a predetermined width and a thickness of about 10 μm is used for this negative electrode current collector 241. An uncoated portion 242 is provided along one lateral-side edge of the negative electrode current collector 241. The negative electrode active material layer 243 is formed on both faces of the negative electrode current collector 241 except for the uncoated portion 242, which is provided in the negative electrode current collector 241. The negative electrode mixture layer is retained by the negative electrode current collector 241, and contains at least a negative electrode active material. In the negative electrode active material layer 243, a negative electrode mixture containing a negative electrode active material is coated on the negative electrode current collector 241.

<<Negative Electrode Active Material Layer 243>>

Figure 5:
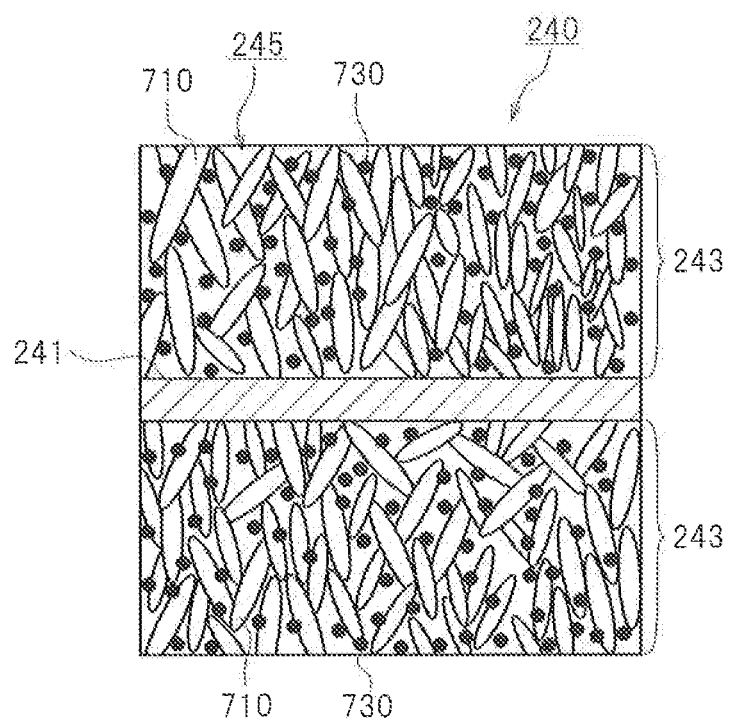
FIG. 5 is a cross-sectional view illustrating the structure of a negative electrode active material layer.

FIG. 5 is a cross-sectional view of the negative electrode sheet 240 of the lithium-ion secondary battery 100. As illustrated in FIG. 5, the negative electrode active material layer 243 contains negative electrode active material particles 710, a thickening agent (not shown), a binder 730, and the like. In FIG. 5, the negative electrode active material particles 710 and the binder 730 in the negative electrode active material layer 243 are enlarged schematically so that the structure of the negative electrode active material layer 243 can be shown clearly.

<<Negative Electrode Active Material Particles 710>>

As the negative electrode active material particles 710, it is possible to use any conventional material used for lithium-ion secondary batteries, either alone or in combination, without any particular limitation. Examples include particulate carbon materials (carbon particles) at least partially containing a graphite structure (a layered structure). More specifically, the negative electrode active material may be natural graphite, natural graphite coated with amorphous carbon material, graphitic materials (graphites), non-graphitizable carbons (hard carbons), graphitizable carbons (soft carbons), and combinations thereof. Here, the figure depicts a case in which what is called flake graphite is used as the negative electrode active material particle 710, but the negative electrode active material particle 710 is not limited to the example shown in the figure.

<<Thickening Agent and Solvent>>

The negative electrode active material layer 243 is formed, for example, in the following manner: the negative electrode active material particles 710 and the binder 730 mentioned above are mixed into a paste form (slurry form) in a solvent to prepare a negative electrode mixture, which is then coated onto the negative electrode current collector 241, dried, and pressure-rolled. In this case, either an aqueous solvent or a non-aqueous solvent can be used as the solvent for the negative electrode mixture. A preferable example of the non-aqueous solvent is N-methyl-2-pyrrolidone (NMP). For the binder 730, any of the polymer materials shown as the examples of the binder 630 of the above-described positive electrode active material layer 223 (see FIG. 4) may be used. The above-mentioned examples of the polymer materials used as the binder 630 of the positive electrode active material layer 223 can also be used for the purpose of obtaining the function as an addition agent, such as a thickening agent for the positive electrode mixture, in addition to the function as the binder.

<<Separators 262 and 264>>

Each of the separators 262 and 264 is a member for separating the positive electrode sheet 220 and the negative electrode sheet 240 from each other, as illustrated in FIGS. 1 and 2. In this example, each of the separators 262 and 264 is made of a strip-shaped sheet having a plurality of micropores and having a predetermined width. For the separators 262 and 264, it is possible to use, for example, a single layer separator or a multi-layered separator, which is made of porous polyolefin-based resin. In this example, as illustrated in FIGS. 2 and 3, the width b1 of the negative electrode active material layer 243 is slightly wider than the width a1 of the positive electrode active material layer 223. In addition, the width c1, c2 of the separators 262 and 264 is slightly wider than the width b1 of the negative electrode active material layer 243 (c1, c2>b1>a1).

In the example shown in FIGS. 1 and 2, each of the separators 262 and 264 is made of a sheet-shaped member. Each of the separators 262 and 264 should be a member that insulates the positive electrode sheet 223 and the negative electrode sheet 243 from each other and at the same time permits transfer of electrolyte. Therefore, the separators are not limited to sheet-shaped members. In place of the sheet-shaped member, each of the separators 262 and 264 may be made of, for example, a layer of insulative particles that are formed on a surface of the positive electrode active material layer 223 or the negative electrode active material layer 243. The insulative particles may be made of an insulative inorganic filler (for example, a filler of metal oxide or metal hydroxide) or insulative resin particles (for example, particles of polyethylene or polypropylene).

In this wound electrode assembly 200, as illustrated in FIGS. 2 and 3, the positive electrode sheet 220 and the negative electrode sheet 240 are stacked with the separators 262 and 264 interposed therebetween, so that the positive electrode sheet 220 and the negative electrode sheet 240 face each other. More specifically, the positive electrode sheet 220, the negative electrode sheet 240, and the separators 262 and 264 are stacked in the wound electrode assembly 200 in the following order: the positive electrode sheet 220, the separator 262, the negative electrode sheet 240, and the separator 264.

In this case, the positive electrode active material layer 223 and the negative electrode active material layer 243 face each other while the separators 262 and 264 are interposed therebetween. The portion of the positive electrode current collector 221 being devoid of the positive electrode active material layer 223 (i.e., the uncoated portion 222) protrudes from one side end of the region where the positive electrode active material layer 223 and the negative electrode active material layer 243 face each other. The portion of the negative electrode current collector 241 being devoid of the negative electrode active material layer 243 (i.e., the uncoated portion 242) protrudes from the opposite end to the side end from which the uncoated portion 222 protrudes. In such s stacked state, the positive electrode sheet 220, the negative electrode sheet 240, and the separators 262 and 264 are wound together around a winding axis WL, which is set along a lateral direction.

<<Battery Case 300>>

In this example, as illustrated in FIG. 1, the battery case 300 is what is called a prismatic battery case, and it includes a case main body 320 and a lid 340. The case main body 320 has a closed-bottom quadrangular prismatic tubular shape, and is a flat-box-shaped case and whose one side face (upper face) is open. The lid 340 is a member that is attached to the opening of the case main body 320 (the opening in the upper face thereof) to close the opening.

For a secondary battery used for a vehicle, it is desired to improve the weight energy efficiency (the capacity of the battery per unit weight) in order to improve the fuel consumption of the vehicle. In this embodiment, a lightweight metal such as aluminum or an aluminum alloy (aluminum in this example) is employed for the case main body 320 and the lid 340, which constitute the battery case 300. This enables to improve the weight energy efficiency.

The battery case 300 has a flat rectangular internal space as the space for accommodating the wound electrode assembly 200. As illustrated in FIG. 1, the flat internal space of the battery case 300 is slightly wider than the wound electrode assembly 200. In this embodiment, the battery case 300 has the case main body in a closed-bottom quadrangular prismatic tubular shape and the lid 340 closing the opening of the case main body 340. To the lid 340 of the battery case 300, electrode terminals 420 and 440 are attached. The electrode terminals 420 and 440 penetrate through the battery case 300 (the lid 340) and stick out outside the battery case 300. The lid 340 is provided with a filling port 350 and a safety vent 360.

Figure 6:
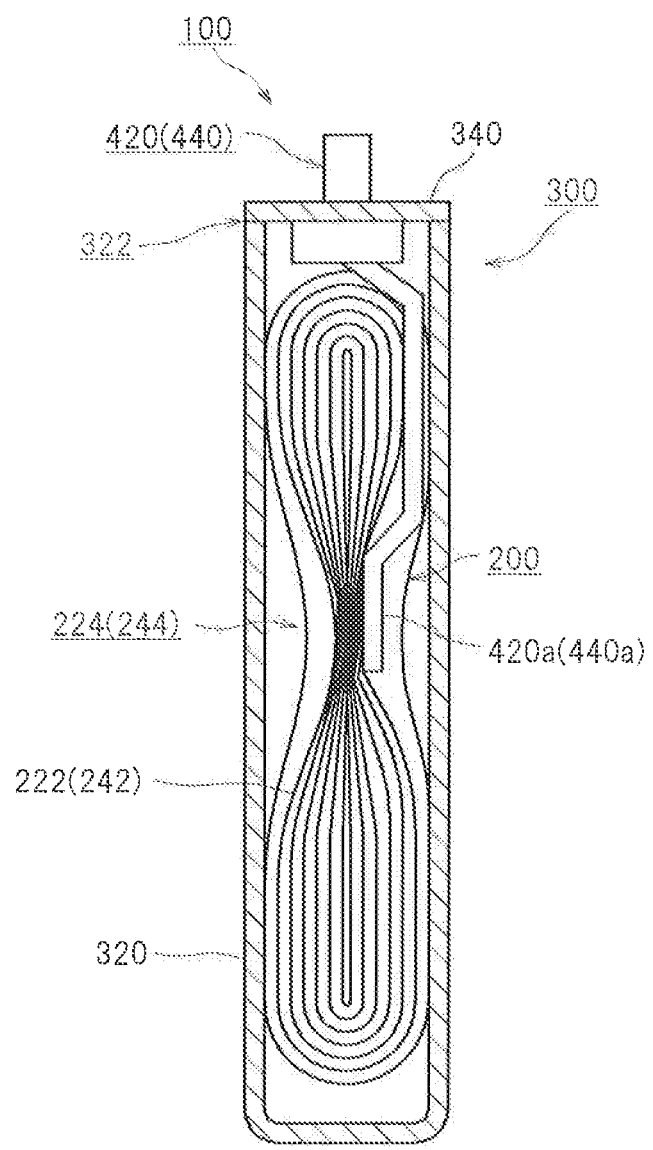
FIG. 6 is a side view illustrating a portion where an uncoated portion of the wound electrode assembly is welded to an electrode terminal.

As illustrated in FIG. 2, the wound electrode assembly 200 is deformed into a flat shape in one direction perpendicular to the winding axis WL. In the example shown in FIG. 2, the uncoated portion 222 of the positive electrode current collector 221 and the uncoated portion 242 of the negative electrode current collector 241 are exposed from the respective sides of the separators 262 and 264 in a spiral shape. As illustrated in FIG. 6, in this embodiment, the intermediate portions 224 and 244 of the uncoated portions 222 and 242 are gathered and welded to the foremost end portions 420a and 440a of the respective electrode terminals 420 and 440. In this case, from the viewpoint of the difference in materials, ultrasonic welding, for example, is used for welding the electrode terminal 420 to the positive electrode current collector 221. On the other hand, resistance welding, for example, is used for welding the electrode terminal 440 to the negative electrode current collector 241. Here, FIG. 6 is a side view illustrating the portion where the intermediate portion 224 (244) of the uncoated portion 222 (242) of the wound electrode assembly 200 is welded to the electrode terminal 420 (440), and it is also a cross-sectional view taken along line VI-VI in FIG. 1.

The wound electrode assembly 200 is attached to the electrode terminals 420 and 440 fixed to the lid 340 while it is pressed into a flat shape. As illustrated in FIG. 1, the wound electrode assembly 200 is accommodated in the flat internal space of the case main body 320. The case main body 320 is closed by the lid 340 after the wound electrode assembly 200 is placed therein. A joint portion 322 (see FIG. 1) between the lid 340 and the case main body 320 is welded and sealed by, for example, laser welding. Thus, in this example, the wound electrode assembly 200 is positioned in the battery case 300 by the electrode terminals 420 and 440 fixed to the lid 340 (i.e., the battery case 300).

<<Electrolyte Solution>>

Thereafter, an electrolyte solution is filled into the battery case 300 through the filling port 350 provided in the lid 340. What is called a non-aqueous electrolyte solution, which does not use water as the solvent, is used as the electrolyte solution. In this example, the electrolyte solution is an electrolyte solution in which $LiPF_6$ is contained at a concentration of about 1 mol/L in a mixed solvent of ethylene carbonate and diethyl carbonate (e.g., a mixed solvent with a volume ratio of about 1:1). Thereafter, a metal sealing cap 352 is attached (welded, for example) to the filling port 350 to seal the battery case 300. It should be noted that the electrolyte solution is not limited to the example of the electrolyte solution described herein. For example, any non-aqueous electrolyte solution that has conventionally been used for lithium-ion secondary batteries may be used as appropriate.

<<Pore>>

Here, the positive electrode active material layer 223 has tiny gaps 225, which may be called voids, for example, between the positive electrode active material particles 610 and the particles of the conductive agent 620 (see FIG. 4). The tiny gaps in the positive electrode active material layer 223 can be impregnated with the electrolyte solution (not shown). Also, the negative electrode active material layer 243 has tiny gaps, which may be called voids, for example, between the particles of the negative electrode active material particles 710 (see FIG. 5). Herein, such gaps (or voids) 225 and 245 are referred to as "pores" as appropriate. In addition, in the wound electrode assembly 200, the uncoated portions 222 and 242 are wound in a spiral form at the respective sides along the winding axis WL, as illustrated in FIG. 2. The electrolyte solution can infiltrate through the gaps in the uncoated portions 222 and 242 at the respective sides 252 and 254 along the winding axis WL. Thus, in the lithium-ion secondary battery 100, the electrolyte solution is impregnated throughout the positive electrode active material layer 223 and the negative electrode active material layer 243.

<<Gas Release Passage>>

In this example, the flat internal space of the battery case 300 is slightly wider than the wound electrode assembly 200 deformed in a flat shape. Gaps 310 and 312 are provided between the wound electrode assembly 200 and the battery case 300 at the respective sides of the wound electrode assembly 200. Each of the gaps 310 and 312 serves as a gas release passage. For example, when the temperature of the lithium-ion secondary battery 100 abnormally rises such as in the case of overcharging, it is possible that the electrolyte solution may be decomposed and gas may be generated abnormally. In this embodiment, the abnormally generated gas can move toward the safety vent 360 through the gaps 310 and 312 between the wound electrode assembly 200 and the battery case 300, and is discharged out of the battery case 300 from the safety vent 360.

In the lithium-ion secondary battery 100, the positive electrode current collector 221 and the negative electrode current collector 241 of the wound electrode assembly 200 are electrically connected to an external device via the electrode terminals 420 and 440 penetrating through the battery case 300. The operation of the lithium-ion secondary battery 100 during charge and during discharge will be described in the following.

<<Operation During Charge>>

Figure 7:
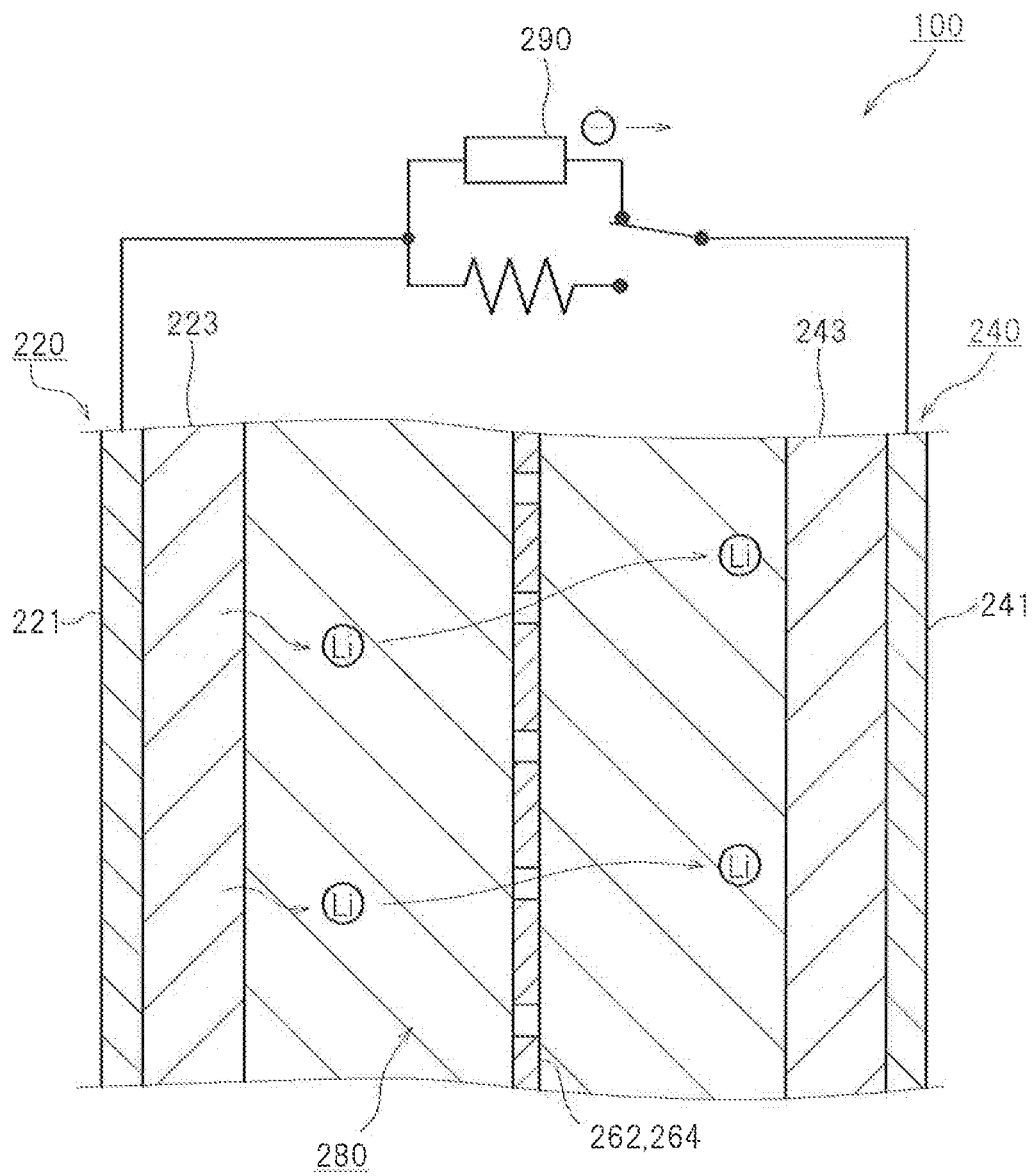
FIG. 7 is a view schematically illustrating a state of the lithium-ion secondary battery during charge.

FIG. 7 schematically illustrates the state of the lithium-ion secondary battery 100 during charge. During charge, the electrode terminals 420 and 440 (see FIG. 1) of the lithium-ion secondary battery 100 are connected to a charger 290, as illustrated in FIG. 7. By the working of the charger 290, lithium ions (Li) are released into the electrolyte solution 280 from the positive electrode active material in the positive electrode active material layer 223 during charge. In addition, electric charge is released from the positive electrode active material layer 223. The released electric charge is transferred through the conductive agent (not shown) to the positive electrode current collector 221 and further transferred through the charger 290 to the negative electrode sheet 240. In the negative electrode sheet 240, electric charge is stored, and also the lithium ions (Li) in the electrolyte solution 280 are absorbed and stored in the negative electrode active material within the negative electrode active material layer 243.

<<Operation During Discharge>>

FIG. 8 schematically illustrates the state of the lithium-ion secondary battery 100 during discharge. During discharge, as illustrated in FIG. 8, electric charge is transferred from the negative electrode sheet 240 to the positive electrode sheet 220, and at the same time, the lithium ions stored in the negative electrode active material layer 243 are released into the electrolyte solution 280. Also, in the positive electrode, the lithium ions in the electrolyte solution 280 are absorbed into the positive electrode active material within the positive electrode active material layer 223.

Thus, in the charge and discharge of the lithium-ion secondary battery 100, lithium ions are transferred back and forth between the positive electrode active material layer 223 and the negative electrode active material layer 243 via the electrolyte solution 280. In addition, during charge, electric charge is transferred from the positive electrode active material through the conductive agent to the positive electrode current collector 221. On the other hand, during discharge, electric charge is returned from the positive electrode current collector 221 through the conductive agent to the positive electrode active material.

In the case of charge, when the transfer of lithium ions and the transfer of electrons take place more smoothly, it is believed possible to achieve more efficient and rapid charging. In the case of discharge, when the transfer of lithium ions and the transfer of electrons take place more smoothly, the resistance in the battery becomes lower and the amount of discharge becomes higher, so it is believed possible to improve the output power of the battery.

<<Other Battery Constructions>>

It should be noted that the foregoing merely shows one example of the lithium-ion secondary battery. The lithium-ion secondary battery is not limited to the foregoing embodiment. In addition, the electrode sheet in which an electrode mixture is coated on a metal foil may be used in various other types of battery constructions. For example, cylindrical batteries and laminate-type batteries are known as other types of battery constructions. The cylindrical battery is a battery in which a wound electrode assembly is enclosed in a cylindrical battery case. The laminate-type battery is a battery in which positive electrode sheets and negative electrode sheets are stacked on each other with separators interposed therebetween.

<<Method of Testing a Secondary Battery>>

Hereinbelow, a method of testing a secondary battery according to one embodiment of the present invention will be described based on the above-described lithium-ion secondary battery 100. Here, the drawings of the above-described lithium-ion secondary battery 100 are referenced as appropriate and the same reference numerals and symbols are used to describe the parts and portions of the lithium-ion secondary battery 100.

The lithium-ion secondary battery 100 has, as illustrated in FIGS. 1 and 2, the positive electrode current collector 221, the positive electrode active material layer 223 retained by the positive electrode current collector 221, the negative electrode current collector 241, and the negative electrode active material layer 243 retained by the negative electrode current collector 241 and disposed so as to face the positive electrode active material layer 223. As already described above, the width of the negative electrode active material layer 243 is wider than that of the positive electrode active material layer 223. In addition, the negative electrode active material layer 243 is disposed so as to cover the positive electrode active material layer 223.

The present inventor believes that it is desirable to establish a non-destructive and easy testing method concerning winding misalignment of such a wound electrode assembly 200. If such a testing method is established, the work load in the testing process can be lightened, and it will be made possible to conduct a full inspection before the shipment of the lithium-ion secondary battery 100. This can further significantly reduce the possibility of shipping the problematic products with winding misalignment in the wound electrode assembly 200.

Based on such a concept, the present inventor discovered that, for the lithium-ion secondary battery 100, the degree of winding misalignment of the wound electrode assembly 200 can be evaluated by prescribed charging (step A), setting aside (step B), discharging (step C), and detecting a battery voltage increase thereafter (step D). Such a method of testing a secondary battery will be described in the following.

FIGS. 9 through 13 schematically illustrate the distributions of lithium in the positive electrode active material layer 223 and the negative electrode active material layer 243 respectively at the initial state and steps A through D. In FIGS. 9 through 13, the black dots "●" represent lithium L, and in the case of the negative electrode active material layer 243, white dots "○" represent the regions in which lithium can be absorbed (i.e., the regions in which lithium has not been absorbed). In the case of the positive electrode active material layer 223, white dots "○" represent the regions from which lithium has been released. The regions of the negative electrode active material layer 243 in which lithium has not been absorbed and the regions of the positive electrode active material layer 223 from which lithium has been released are indicated by reference character D.

A region F1 represents an opposed region in which the positive electrode active material layer 223 and the negative electrode active material layer 243 are opposed to each other, and regions F2 and F3 represent regions in which the negative electrode active material layer 243 protrudes from the positive electrode active material layer 223 (i.e., unopposed regions). As illustrated in FIGS. 9 through 13, the unopposed regions F2 and F3 of the negative electrode active material layer 243 exist at both side ends of the positive electrode active material layer 223 so as to have approximately the same width as each other.

FIGS. 9 through 13 schematically show the case that both side ends of the negative electrode active material layer 243 protrude from the positive electrode active material layer 223 at approximately the same width. How much both side ends of the negative electrode active material layer 243 are allowed to protrude from the positive electrode active material layer 223 can be determined as a matter of designing the secondary battery, taking various circumstances into consideration. Accordingly, it is not always necessary that both side ends of the negative electrode active material layer 243 of the secondary battery protrude from the positive electrode active material layer 223 with the same width as each other. FIG. 14 shows changes of positive electrode potential VA, negative electrode potential VB, and battery voltage VO from the initial state to steps A through D. It should be noted that the battery voltage VO is the potential difference (VO=VA−VB) between the positive electrode potential VA and the negative electrode potential VB.

<<Initial State>>

Before the lithium-ion secondary battery 100 is charged for the first time (i.e., initial charging is performed) after having been assembled, the positive electrode active material layer 223, which contains lithium-transition metal oxide as the positive electrode active material particles, contains lithium L in its initial state, as illustrated in FIG. 9. On the other hand, the negative electrode active material layer 243 in its initial state has not yet absorbed lithium, and it has the regions D in which lithium can enter during charge.

<<Step A: Charging Step>>

Step A is a step of charging the lithium-ion secondary battery 100 (i.e., secondary battery) to a predetermined charge voltage. For example, it is preferable that the lithium-ion secondary battery 100 be charged to the predetermined charge voltage by CC-CV charging. More specifically, as illustrated in FIG. 14, for example, the lithium-ion secondary battery 100 is charged at a constant current of 1 C (CC charging) until the battery voltage reaches 4.1 V, and thereafter further charged at a charge voltage of 4.1 V for 1.5 hours (CV charging). As a result, as illustrated in FIG. 10, the positive electrode active material layer 223 releases lithium, and the negative electrode active material layer 243 absorbs lithium L.

In the lithium-ion secondary battery 100, as illustrated in FIG. 10, the negative electrode active material layer 243 is wider than the positive electrode active material layer 223, so it protrudes from both lateral side ends of the positive electrode active material layer 223. In the charging in step A, the reaction takes place more easily in the region where the positive electrode active material layer 223 and the negative electrode active material layer 243 are opposed to each other. For this reason, at the time just after the charging in step A, a large amount of lithium is distributed in the opposed region F1 in the negative electrode active material layer 243, which is opposed to the positive electrode active material layer 223. On the other hand, a large number of regions D, which can absorb lithium, exist in the unopposed regions F2 and F3 of the negative electrode active material layer 243, which jut out from the positive electrode active material layer 223, at the time just after the charging in step A.

<<Step B: Setting-Aside Step>>

Step B is a step of setting the lithium-ion secondary battery 100 (i.e., secondary battery) for a predetermined time after the step A. In this step B, the lithium-ion secondary battery 100 having been charged in step A is substantially not discharged but is set aside for a predetermined time tb at the battery voltage charged in step A (at 4.1 V herein). In such a step B, as illustrated in FIG. 11, lithium L is uniformly distributed over the negative electrode active material layer 243 so as to even out the potential differences in the negative electrode active material layer 243, and consequently, lithium is absorbed also in the unopposed regions F2 and F3 of the negative electrode active material layer 243. Here, the time tb for which the lithium-ion secondary battery 100 is set aside should be a period of time for lithium L to be distributed substantially uniformly over the negative electrode active material layer 243. For example, it is preferable that the time tb be set to equal to or longer than 1 day (24 hours), more preferably equal to or longer than 2 days (48 hours) or 3 days (72 hours), still more preferably about 10 days (240 hours).

<<Step A: Discharging Step>>

Step C is a step of discharging the secondary battery to a predetermined discharge voltage after the step B. For example, it is preferable that the lithium-ion secondary battery 100 be discharged to the predetermined voltage by CC discharging. Herein, as illustrated in FIG. 14, the lithium-ion secondary battery 100 is discharged at a constant current of 1 C until the battery voltage reaches 3.0 V (CC discharging). As a result, as illustrated in FIG. 13, the negative electrode active material layer 243 releases lithium, and the positive electrode active material layer 223 absorbs lithium L.

In this step C, the negative electrode active material layer 223 releases lithium, and the positive electrode active material layer 223 absorbs lithium. At this time, as illustrated in FIG. 12, the discharging in step C takes place especially easily in the opposed region F1, in which the negative electrode active material layer 243 and the positive electrode active material layer 223 are opposed to each other. Therefore, at the time just after the discharging of step C, the opposed region F1, in which the negative electrode active material layer 243 and the positive electrode active material layer 223 are opposed to each other, is in such a state that lithium has been released therefrom, but in the unopposed regions F2 and F3, lithium is not released but remains therein. In addition, as for the unopposed regions F2 and F3 of the negative electrode active material layer 243 as well, the portions thereof that are nearer the opposed region F1 of the negative electrode active material layer 243 are more likely to release lithium easily, but the regions thereof that are farther away from the opposed region F1 are more apt to permit lithium to remain therein.

Thus, at the time just after step C, lithium L has been released from the opposed region F1 of the negative electrode active material layer 243, as illustrated in FIG. 12, so the proportion of the regions D, in which lithium is not absorbed and lithium can enter during charge, is high in the opposed region F1. In the unopposed regions F2 and F3 of the negative electrode active material layer 243, lithium L remains. Moreover, as for the unopposed regions F2 and F3 of the negative electrode active material layer 243 as well, the portions thereof that are farther away from the opposed region F1 of the negative electrode active material layer 243 contain more remaining lithium than the portions thereof closer to the opposed region F1.

<<Step D: Voltage Increase Detecting Step>>

Step D is a step of detecting a voltage increase X for a preset time t2 after a predetermined time t1 has elapsed after the step C, as illustrated in FIG. 14. In step C, which is the discharging step, an electrochemical polarization is caused by the discharging. Specifically, due to the current conduction associated with the discharging, the battery voltage is shifted from the equilibrium value. When the discharging of step C finishes, the electrochemical polarization is gradually neutralized. In this process in which the electrochemical polarization is neutralized, the battery voltage changes greatly. Therefore, in step D, taking into consideration the time necessary for the electrochemical polarization to be neutralized, the voltage increase X for the preset time t2 is detected after the predetermined time t1 has elapsed. This enables to detect the voltage increase X from the time point at which the electrochemical polarization has been neutralized.

The voltage of the lithium-ion secondary battery 100 is determined by the potential difference between the positive electrode active material layer 223 and the negative electrode active material layer 243 in the opposed region F1. As illustrated in FIG. 12, the potential of the opposed region F1 of the negative electrode active material layer 243 decreases when lithium L is released from the opposed region F1 of the negative electrode active material layer 243. Therefore, when the change of the voltage is measured over the period of the preset time t2 after the predetermined time t1 has elapsed in step D, the voltage of the lithium-ion secondary battery slightly increases, although the increase may be small. Thus, by measuring the voltage increase X for the preset time t2 after the predetermined time t1 has elapsed, it is made possible to detect the battery voltage increase X from the state at which the electrochemical polarization is substantially neutralized after discharging.

<<Evaluation of Winding Misalignment>>

The present inventor discovered that the measurement of how much the negative electrode active material layer 243 covers the positive electrode active material layer 223 can be evaluated based the voltage increase X detected in step D. In other words, the method of testing a secondary battery can evaluate the measurement of how much the negative electrode active material layer 243 covers the positive electrode active material layer 223 (i.e., the measurement of winding misalignment) based on the voltage increase X detected in step D.

As described above, lithium tends to be released easily from the opposed region F1 of the negative electrode active material layer 243 in step C. In addition, as for the unopposed regions F2 and F3 of the negative electrode active material layer 243, the regions thereof that are nearer the opposed region F1 of the negative electrode active material layer 243 release lithium more easily, while the regions thereof that are farther away from the opposed region F1 are more apt to permit lithium to remain therein.

For example, when the negative electrode active material layer 243 protrudes from both side ends of the positive electrode active material layer 223 by approximately the same width, the unopposed regions F2 and F3 exist at both side ends of the positive electrode active material layer 223 so as to have approximately the same width as each other, as illustrated in FIG. 12. In this case, in step C, approximately the same amount of lithium remains in both the unopposed regions F2 and F3 of the respective side ends of the positive electrode active material layer 223.

In contrast, as illustrated in FIG. 15, for example, when one of the unopposed regions F2 and F3 of the negative electrode active material layer 243, the unopposed region F2 at one side end, is narrower and the unopposed region F3 at the opposite side end is wider, the proportion of the region away from the positive electrode active material layer 223 is greater in the unopposed region F3, which is at the opposite side end. In this case, at the time just after step C, the amount of lithium remaining in the unopposed region F2 decreases, but the amount of lithium remaining in the unopposed region F3 increases significantly. For this reason, at the time just after step C, the amount of lithium remaining in the unopposed regions F2 and F3 of the negative electrode active material layer 243 tends to increase in total. As a result, the battery voltage increase X detected in step D tends to be greater than the case where the unopposed regions F2 and F3 exist at both side ends of the positive electrode active material layer 223 at approximately the same width as each other (see FIG. 12).

In FIG. 15, the unopposed region F2 at the side end of the negative electrode active material layer 243 that is provided with the uncoated portion 242 is narrower, while the unopposed region F3 at the opposite side end thereto is wider. On the other hand, in FIG. 16, the unopposed region F2 of the negative electrode active material layer 243 at the side end thereof that is provided with the uncoated portion 242 is wider, while the unopposed region F3 at the opposite end thereto is narrower. In this case as well, at the time just after step C, the amount of lithium remaining in the unopposed region F2 increases significantly, so the amount of lithium remaining in the unopposed regions F2 and F3 of the negative electrode active material layer 243 tends to increase in total. Accordingly, the battery voltage increase X detected in step D tends to be greater than the case where the unopposed regions F2 and F3 exist at both side ends of the positive electrode active material layer 223 at approximately the same width as each other (see FIG. 12).

In this embodiment, the standard configuration of the lithium-ion secondary battery 100 is, as illustrated in FIG. 16, such that in the negative electrode active material layer 243, the unopposed region F2 at the side end thereof provided with the uncoated portion 242 is set wider while the unopposed region F3 at the opposite side end thereto is set narrower. Using the wound electrode assemblies 200 each of whose winding misalignment size Z of the positive electrode active material layer 223 and the negative electrode active material layer 243 is known, test cells were prepared. Then, for each of these test cells, the battery voltage increase X detected in step D was measured. Thereby, the relationship between and the winding misalignment size Z of the positive electrode active material layer 223 and the negative electrode active material layer 243 and the battery voltage increase X detected in step D was obtained. FIG. 17 illustrates one example showing such a relationship between the winding misalignment size Z and the battery voltage increase X.

<<Winding Misalignment Size Z>>

Herein, the winding misalignment size Z is determined based on one of the unopposed regions F2 and F3 of the negative electrode active material layer 243 that has a narrower width in the battery design. For example, when, as illustrated in illustrated in FIG. 15, the unopposed region F2 at the side end provided with the uncoated portion 242 is narrower in the battery design, it is desirable that the winding misalignment size Z of the positive electrode sheet 220 and the negative electrode sheet 240 be determined based on the width of the unopposed region F2. On the other hand, when, as illustrated in FIG. 16, the unopposed region F3 at the opposite side end to the side end provided with the uncoated portion 242 is narrower in the battery design, it is desirable that the winding misalignment size Z of the positive electrode sheet 220 and the negative electrode sheet 240 be determined based on the width of the unopposed region F3. When the unopposed regions F2 and F3 have the same width in the battery design, it is desirable that the winding misalignment size Z be determined based on either one of the unopposed regions.

It should be noted that, as the positive electrode sheet 220 and the negative electrode sheet 240 are strip-shaped members, the winding misalignment size Z of the positive electrode active material layer 223 and the negative electrode active material layer 243 is not necessarily constant along the longitudinal direction of the positive electrode sheet 220. Here, the winding misalignment size Z is defined as the mean value of the winding misalignment sizes Z obtained along the longitudinal direction of the positive electrode sheet 220 and the negative electrode sheet 240. For example, it is desirable that, at a plurality of locations along the longitudinal direction of the positive electrode sheet 220 and the negative electrode sheet 240, the misalignment sizes of the negative electrode active material layer 243 that are deviated from predetermined reference positions relative to the positive electrode active material layer 223 be measured, and the mean value of the misalignment sizes be obtained.

In this embodiment, the unopposed region F3 at the opposite side end to the side end provided with the uncoated portion 242 is narrower, as illustrated in FIG. 16. Therefore, the winding misalignment size Z is determined based on the width of the unopposed region F3. According to the designed value of the test cell, the width of the unopposed region F3, the one of the unopposed regions F2 and F3 of the negative electrode active material layer 243 that has a narrower width, is narrower by about 3 mm than that of the unopposed region F2. It should be noted that FIG. 16 is merely schematic and does not accurately represent the actual sizes of the unopposed regions F2 and F3.

Here, when the width of the unopposed region F3, which is the narrower one of the unopposed regions F2 and F3 of the negative electrode active material layer 243, is equal to the designed value, the winding misalignment size Z is defined as zero. When the width of the unopposed region F3, which is the narrower one of the unopposed regions F2 and F3 of the negative electrode active material layer 243, is wider than the designed value, the winding misalignment size Z is defined as plus. When the width of the unopposed region F3, which is the narrower one of the unopposed regions F2 and F3 of the negative electrode active material layer 243, is narrower than the designed value, the winding misalignment size Z is defined as minus. Thus, when the winding misalignment size Z is plus, it means that the difference between the unopposed region F3, the narrower one of the unopposed regions F2 and F3 of the negative electrode active material layer 243, and the unopposed region F2, the wider one, is small. On the other hand, when the winding misalignment size Z is minus, it means that the difference between the unopposed region F3, the narrower one of the unopposed regions F2 and F3 of the negative electrode active material layer 243, and the unopposed region F2, the wider one, is large.

<<Relationship Between the Winding Misalignment Size Z and the Battery Voltage Increase Detected in Step D>>

The relationship between the winding misalignment size Z and the battery voltage increase detected in step D is as follows. As illustrated in FIG. 17, when the winding misalignment size Z becomes plus, the battery voltage increase X obtained in step D becomes smaller. In other words, when the difference between the unopposed region F3, the narrower one of the unopposed regions F2 and F3 of the negative electrode active material layer 243, and the unopposed region F2, the wider one, becomes smaller, the battery voltage increase X obtained in step D accordingly becomes smaller. In contrast, when the winding misalignment size Z becomes minus, the battery voltage increase X obtained in step D becomes larger. In other words, when the difference between the unopposed region F3, the narrower one of the unopposed regions F2 and F3 of the negative electrode active material layer 243, and the unopposed region F2, the wider one, becomes larger, the battery voltage increase X obtained in step D accordingly becomes larger.

Bearing this in mind, the foregoing steps A through D are performed for the lithium-ion secondary batteries 100 the winding misalignment size Z of the positive electrode active material layer 223 and the negative electrode active material layer 243 is known, to obtain the relationship as shown in FIG. 17 between the winding misalignment size Z and the battery voltage increase X detected in step D in advance.

Here, in order to obtain the relationship between the winding misalignment size Z and the battery voltage increase X detected in step D in advance, it is desirable to control the winding misalignment size Z using a winding apparatus for the wound electrode assembly 200 that can accurately control the winding misalignment size Z of the positive electrode active material layer 223 and the negative electrode active material layer 243. For example, it is possible to obtain a wound electrode assembly 200 whose winding misalignment size Z of the positive electrode active material layer 223 and the negative electrode active material layer 243 is controlled accurately by making the winding speed of the winding apparatus for the wound electrode assembly 200 sufficiently slow to such a speed that the winding misalignment size Z can be accurately controlled.

In this case, the difference between the winding misalignment size Z set by the winding apparatus and the actual winding misalignment size Z may be detected by measuring the winding misalignment size Z while spreading out the wound electrode assembly 200. Here, when the winding misalignment size Z can be controlled sufficiently accurately with the winding apparatus for the wound electrode assembly 200, the winding misalignment size Z set by the winding apparatus may be employed as the winding misalignment size Z of the positive electrode active material layer 223 and the negative electrode active material layer 243 for convenience.

In this case, at the time of preparing the wound electrode assembly 200, the winding misalignment size Z of the positive electrode active material layer 223 and the negative electrode active material layer 243 is varied to prepare lithium-ion secondary batteries 100 having varying winding misalignment sizes Z between the positive electrode active material layer 223 and the negative electrode active material layer 243. Then, for the lithium-ion secondary batteries 100 having varying winding misalignment sizes Z between the positive electrode active material layer 223 and the negative electrode active material layer 243, the battery voltage increase X in step D should be obtained to obtain the relationship between the winding misalignment size Z and the battery voltage increase X detected in step D.

<<Step G: Estimating Winding Misalignment Size Z>>

Next, for a lithium-ion secondary battery 100 whose winding misalignment size Z of the positive electrode active material layer 223 and the negative electrode active material layer 243 is unknown (which is the same type of lithium-ion secondary battery 100 fabricated by usual mass production), the above-described steps A through D are performed. Thus, for the just-mentioned lithium-ion secondary battery 100, the battery voltage increase X detected in step D is obtained. Meanwhile, based on the lithium-ion secondary batteries 100 each of whose winding misalignment size Z of the positive electrode active material layer 223 and the negative electrode active material layer 243 is known, the relationship between the winding misalignment size Z and the battery voltage increase X detected in step D is obtained in advance (step H). In this way, based on the relationship between the winding misalignment size Z and the battery voltage increase X detected in step D that has been obtained in advance, it is possible to estimate a measurement of the winding misalignment size Z of the positive electrode active material layer 223 and the negative electrode active material layer 243 for a lithium-ion secondary battery 100 whose winding misalignment size Z is unknown, from the battery voltage increase X detected in step D.

As described above, a relationship between the winding misalignment size Z of the positive electrode active material layer 223 and the negative electrode active material layer 243 and the battery voltage increase X detected in step D should be obtained in advance. This makes it possible to estimate the winding misalignment size Z of the positive electrode active material layer 223 and the negative electrode active material layer 243 for a lithium-ion secondary battery 100 whose winding misalignment size Z of the positive electrode active material layer 223 and the negative electrode active material layer 243 is unknown, based on the battery voltage increase X detected in step D.

<<Step I (Step E): Pass-or-Fail Determination>>

In this case, the method of testing a secondary battery may further include step I (step E) of performing a pass-or-fail determination about the winding misalignment size Z of the positive electrode active material layer 223 and the negative electrode active material layer 243 of the secondary battery (i.e., the measurement of how much the negative electrode active material layer 243A covers the positive electrode active material layer 223), by providing a threshold value of the battery voltage increase X obtained in the step D. In this case, the threshold value may be determined based on a relationship between secondary batteries each of whose winding misalignment size Z of the positive electrode active material layer 223 and the negative electrode active material layer 243 is known and the battery voltage increase of each of these secondary batteries that is detected in the step D.

For example, as illustrated in FIG. 17, a relationship between the winding misalignment size Z of the positive electrode active material layer 223 and the negative electrode active material layer 243 and the battery voltage increase X detected in step D should be obtained in advance. In this case, based on the just-mentioned relationship, the pass-or-fail determination can be made for a lithium-ion secondary battery 100 whose winding misalignment size Z of the positive electrode active material layer 223 and the negative electrode active material layer 243 is unknown.

For example, using secondary batteries each of whose winding misalignment size Z of the positive electrode active material layer 223 and the negative electrode active material layer 243 is known, the relationship between the winding misalignment size Z and the battery voltage increase X detected in step D is obtained in advance. Then, the battery voltage increase X detected in step D is obtained for an unknown lithium-ion secondary battery 100. From the relationship between the winding misalignment size Z and the battery voltage increase X detected in step D that has been obtained in advance, the winding misalignment size Z of the just-mentioned lithium-ion secondary battery 100 can be estimated based on the battery voltage increase X detected in step D.

It is also possible to perform the pass-or-fail determination for the lithium-ion secondary battery 100 by providing threshold values X1 and X2 of the battery voltage increase X detected in step D. Specifically, it is possible to set pass-or-fail determination threshold values Z1 and Z2 of the winding misalignment size Z of the lithium-ion secondary battery 100 that is estimated from the battery voltage increase X detected in step D. In this case, it is also possible to set threshold values X1 and X2 of the battery voltage increase X detected in step D based on the foregoing threshold values Z1 and Z2, to perform the pass-or-fail determination for the lithium-ion secondary battery 100.

For example, as illustrated in FIG. 17, if the pass-or-fail determination threshold values Z1 and Z2 of the winding misalignment size Z are set to be ±0.5 mm (|Z|≤0.5), the threshold values X1 and X2 of the battery voltage increase X detected in step D are set based on the threshold values Z1 and Z2. Therefore, it is possible that a pass-or-fail determination may be performed for a lithium-ion secondary battery 100 based on the battery voltage increase X detected in step D. For example, a secondary battery can be determined as a good product when the battery voltage increase X detected in step D is in the range X1≤X≤X2, while it can be determined as a defective produce when the battery voltage increase X detected in step D is out of the range X1≤X≤X2. In the example shown in FIG. 17, the relationship between the winding misalignment size Z and the battery voltage increase X detected in step D is approximated by fitting a straight line, but it is also possible to set an appropriate fitted curve.

Although this is substantially the same as above, it is also possible to set pass-or-fail determination threshold values of the winding misalignment size Z, so that the pass-or-fail determination can be made based on the winding misalignment size Z estimated from the battery voltage increase X detected in step D.

As described above, the winding misalignment size Z of the positive electrode active material layer 223 and the negative electrode active material layer 243 of a secondary battery can be estimated based on the battery voltage increase X detected in step D. In addition, it is possible to prepare secondary batteries each of whose winding misalignment size Z of the positive electrode active material layer 223 and the negative electrode active material layer 243 is known, and to obtain a relationship between the winding misalignment size Z of the positive electrode active material layer 223 and the negative electrode active material layer 243 and the battery voltage increase X detected in the step D, based on the prepared secondary batteries. In this case, based on the just-mentioned relationship, it is possible to estimate the winding misalignment size Z of the positive electrode active material layer 223 and the negative electrode active material layer 243 for a secondary battery whose winding misalignment size Z of the positive electrode active material layer 223 and the negative electrode active material layer 243 is unknown, from the battery voltage increase X detected in step D. It is possible to perform a pass-or-fail determination about the winding misalignment size Z of the positive electrode active material layer 223 and the negative electrode active material layer 243 of a secondary battery, by providing a threshold value of the battery voltage increase X obtained in the step D.

As described above, the method of testing a secondary battery can evaluate a measurement of how much the negative electrode active material layer 243 covers the positive electrode active material layer 223 based on the battery voltage increase X detected in the step D. Moreover, this method of testing a secondary battery can test a secondary battery in a non-destructive manner. In addition, the method of testing a secondary battery may perform charging (step A), setting aside (step B), discharging (step C), and measuring a battery voltage increase (step D) for the lithium-ion secondary battery 100. Therefore, this method can be performed relatively easily in the production line. For this reason, it is also possible to carry out a full inspection before the products of lithium-ion secondary battery 100 are shipped. This can further significantly reduce the possibility of shipping the problematic products with winding misalignment in the wound electrode assembly 200.

That is, the winding apparatus for the wound electrode assembly 200 has become more accurate, and accordingly, the possibility of shipping the problematic products with winding misalignment in the wound electrode assembly 200 is fairly low, even at the current state of the art. In addition to that, if such a non-destructive testing method is adopted so that a full inspection is made possible, the possibility of shipping the problematic products with winding misalignment in the wound electrode assembly 200 can be reduced even further.

Hereinabove, the method of testing a secondary battery according to one embodiment of the present invention has been described, but the method of testing a secondary battery according to the invention is not limited to the embodiment described above.

<<Secondary Battery>>

For example, the lithium-ion secondary battery 100 that is a non-aqueous electrolyte secondary battery has been illustrated as the secondary battery in the embodiment described above. The secondary battery is not necessarily limited to either the lithium-ion secondary battery or the non-aqueous electrolyte secondary battery. As described above, the method of testing a secondary battery involves charging (step A), setting aside (step B), discharging (step C), and measuring a battery voltage increase (step D) for the secondary battery. In the step of setting aside (step B) after the charging, a chemical species serving as the charge carrier in the secondary battery (lithium in the case of the lithium-ion secondary battery 100) is uniformly distributed in the negative electrode active material layer 243 (see FIG. 11). Thereafter, in the step of discharging (step C), the chemical species serving as the charge carrier is released from the opposed region F1 of the negative electrode active material layer 243 that is opposed to the positive electrode active material layer 223. Further thereafter, the winding misalignment size Z of the positive electrode active material layer 223 and the negative electrode active material layer 243 is evaluated based on the battery voltage increase X resulting from the chemical species serving as the charge carrier that has remained in the unopposed regions F2 and F3 of the negative electrode active material layer 243.

In the foregoing embodiment, the testing process is started from the initial state. For example, after a lithium-ion secondary battery is assembled, it is subjected to initial charging. Then, the lithium-ion secondary battery is subjected to conditioning, in which gas generation and a predetermined surface film formation are performed in the secondary battery, followed by a predetermined test, and is then shipped. In the foregoing embodiment, the steps A through D are performed in combination with the just-mentioned initial charging. Note that it is not necessary that the steps A through D of the method of testing a secondary battery according to the present invention be performed from the initial state. The method of testing a secondary battery may be implemented even after the battery was shipped and used, and the winding misalignment size Z of the positive electrode active material layer 223 and the negative electrode active material layer 243 in the battery can be evaluated based on the battery voltage increase X detected in step D. However, by performing the above-described testing for the secondary battery (the steps A through D) in combination with the initial charging, it becomes unnecessary to perform charging and discharging again before shipment. Thus, the work load of the testing before shipment can be reduced by performing the required steps of the method of testing a secondary battery in combination with the initial charging and discharging, which is usually necessary.

<<Charging in Step A>>

Here, it is desirable that the charging in the step A be CCCV charging. By employing CCCV charging, the chemical species serving as the charge carrier can be absorbed over the negative electrode active material layer substantially uniformly. The charging in the step A, however, is not limited to CCCV charging.

In the foregoing embodiment, the charge voltage in the step A is set at 4.1 V. Herein, the charge voltage in the step A is set at 4.1 V because the upper limit of the charge voltage of the lithium-ion secondary battery 100 taken as the example is 4.1 V in a normal use range. It is possible to further raise the upper limit of the charge voltage of lithium-ion secondary batteries, and the research for raising the upper limit of the charge voltage is underway. Therefore, the charge voltage in the step A is not limited to 4.1 V, but it may be 4.2 V or 4.3 V, for example.

In addition, the charge voltage in the step A may be set to a voltage 10% or more higher than a lower limit voltage of a predetermined use range of the secondary battery, for example. For example, when the lower limit voltage of the use range of the lithium-ion secondary battery 100 is 3 V, it is desirable that the charge voltage of the lithium-ion secondary battery 100 in the step A be set to be equal to or higher than 3.3 V.

When the charge voltage in the step A is set to a voltage 10% or more higher than the lower limit voltage of a predetermined use range of the secondary battery, the charge amount substantially necessary for the testing can be ensured. The charge voltage in the step A may be set even higher.

The charge voltage in the step A may be set based on the upper limit voltage of the predetermined use range of the secondary battery. For example, when the upper limit voltage of the use range of the lithium-ion secondary battery 100 is 4 V, it is desirable that the charge voltage in the step A be set to be equal to or higher than the voltage (3.6 V) that is 10% lower than the upper limit voltage (4 V). When the charge voltage in the step A is set based on the upper limit voltage of a predetermined use range of the lithium-ion secondary battery 100 (i.e., the secondary battery) in this way, the charge voltage in the step A can be determined appropriately closer to the upper limit voltage of the use range.

<<Discharging in Step C>>

It is desirable that the discharging in the step C be CC discharging. The use of CC discharging allows the chemical species serving as the charge carrier (lithium in the case of lithium-ion secondary battery) to be released from the opposed region F1 of the negative electrode active material layer, and allows the chemical species serving as the charge carrier (lithium) to remain in the unopposed regions F2 and F3. Although CC discharge is shown as a suitable example of the discharging in the step C, the discharging in the step C is not limited to CC discharging.

It is preferable that the discharge voltage in the step C be set to, for example, a voltage 5% or more lower than the charge voltage in the step A. It is also possible that the discharge voltage in the step C may be set to a voltage 5% or more higher than a lower limit voltage of a predetermined use range of the secondary battery.

In the lithium-ion secondary battery, lithium diffuses easily over the negative electrode active material layer 243 in step D (see FIG. 13). For this reason, this method of testing a secondary battery can be suitably applied to lithium-ion secondary batteries. Moreover, this method of testing a secondary battery is suitable for non-aqueous electrolyte secondary batteries, such as lithium-ion secondary batteries, especially for secondary batteries that have high capacity and high power. In the lithium-ion secondary battery, as illustrated in FIG. 17, the negative electrode potential changes greatly when the battery voltage is lower than or equal to 3.3 V (especially when lower than or equal to 3.1 V, more preferably when lower than or equal to 3.0 V). This indicates that when the battery voltage is lower than or equal to 3.3 V (especially when lower than or equal to 3.1 V, more preferably when lower than or equal to 3.0 V), the negative electrode potential changes easily depending on the amount of the lithium ions absorbed in the negative electrode active material layer.

Accordingly, with the lithium-ion secondary battery, the range of change of the battery voltage is wide when the change of the battery voltage is lower than or equal to 3.3 V (especially when lower than or equal to 3.1 V, more preferably when lower than or equal to 3.0 V). Therefore, when the secondary battery is a lithium-ion secondary battery, it is desirable that the discharge voltage in the step C be set to lower than or equal to 3.3 V, more preferably lower than or equal to 3.1 V, still more preferably lower than or equal to 3.0 V.

Moreover, in this case, it is desirable that the charge voltage in the step A be set to be equal to or higher than a voltage that is about 5% higher than the discharge voltage in the step C. When the charge voltage in the step A is equal to or higher than a voltage about 5% higher than the discharge voltage in the step C, it is appropriate to obtain a voltage increase in step D. It is more preferable that the charge voltage in the step A be higher in order to diffuse lithium sufficiently over the unopposed regions F2 and F3 of the negative electrode active material layer 243 in the step B. For this reason, it is desirable that the charge voltage in the step A be set to be equal to or higher than a voltage about 8% higher, more preferably equal to or higher than a voltage about 10% higher, than the discharge voltage in the step C. When the charge voltage in the step A is higher, the time and cost required for the charging accordingly becomes higher, and the time and cost required for the discharging in step C also becomes higher. For this reason, it is desirable to set the charge voltage in the step A and the discharge voltage appropriately so as to obtain a voltage increase X that is suitable for detecting the winding misalignment size Z in the step D.

<<Predetermined Time t1 in Step D>>

It is preferable that the predetermined time t1 in the step D (see FIG. 17) be set to a time necessary to neutralize an electrochemical polarization associated with the discharging, as described above. The time necessary to neutralize the electrochemical polarization can vary depending on the structure and size of the battery. For this reason, it is desirable to set an appropriate time using a test cell while monitoring the change of the battery voltage as shown in FIG. 17. Generally, it is desirable that the time necessary to neutralize the electrochemical polarization should be such that the battery voltage increase X is detected for a preset time t2 after at least 3 hours have elapsed after the step C. More reliably, it is desirable to detect the battery voltage increase for a preset time t2 after about 5 hours have elapsed.

<<Time t2 for Detecting the Battery Voltage Increase X in Step D>>

In the step D, it is desirable that the battery voltage increase X be detected for a preset time t2, which is set to be at least 5 hours, after a predetermined time t1 has elapsed. More preferably, it is desirable that the battery voltage increase X be detected for about 24 hours after the predetermined time t1 has elapsed.

<<Time for Setting the Secondary Battery Aside in Step B>>

In addition, it is desirable that the time for setting the secondary battery aside in the step B be set to, for example, at least 1 day (24 hours). It is possible that the time for setting the secondary battery aside in the step B may preferably be set to 10 days.

<<Structure of Secondary Battery>>

As for the structure of the secondary battery, it is preferable that the secondary battery have a wound electrode assembly 200, as illustrated in FIGS. 1 through 3. For example, it is desirable that the secondary battery has a strip-shaped positive electrode current collector 223 having a positive electrode active material 223 layer formed on both faces thereof, and a strip-shaped negative electrode current collector 241 having a negative electrode active material layer 243 formed on both faces thereof. Here, it is desirable that the width of the negative electrode active material layer 243 be wider than that of the positive electrode active material layer 223. It is desirable that the positive electrode current collector 221 and the negative electrode current collector 241 be stacked and wound together with the separators 262 and 264 interposed therebetween so that the positive electrode active material layer 223 and the negative electrode active material layer 243 face each other and that the negative electrode active material layer 243 covers the positive electrode active material layer 223.

It is desirable that the positive electrode current collector 221 have a portion being devoid of the positive electrode active material layer 223 (i.e., the uncoated portion 222) along one longitudinal side end thereof. It is also desirable that the negative electrode current collector 241 have a portion being devoid of the negative electrode active material layer 243 (i.e., the uncoated portion 242) along one longitudinal side end thereof. In this case, it is desirable that the portion of the positive electrode current collector 221 being devoid of the positive electrode active material layer 223 protrude from one side end of the opposed region in which the positive electrode active material layer 223 and the negative electrode active material layer 243 are opposed to each other. It is also desirable that the portion of the negative electrode current collector 241 being devoid of the negative electrode active material layer 243 (i.e., the uncoated portion 242) protrude from the opposite side end to the side end from which the portion of the positive electrode current collector 221 being devoid of the positive electrode active material layer 223 protrudes.

In the foregoing examples, a prismatic secondary battery is shown as an example of the secondary battery. However, the method of the present invention can also be applied to cylindrical secondary batteries. The secondary battery having a wound electrode assembly is shown as an example of the secondary battery, and an example of evaluating the winding misalignment size Z of the wound electrode assembly is shown above. However, this method of testing a secondary battery is not limited to the secondary battery having a wound electrode assembly, but can be applied to laminate-type secondary batteries in which a positive electrode sheet and a negative electrode sheet are laminated with a separator interposed therebetween. When applied to the laminate-type secondary battery as well, a measurement of how much the negative electrode active material layer covers the positive electrode active material layer can be evaluated based on the battery voltage increase detected in step D.

In this case, it is possible to perform a pass-or-fail determination (step E) about a measurement of how much the negative electrode active material layer of the secondary battery covers the positive electrode active material layer, by providing a threshold value of the battery voltage increase obtained in the step D. In the step E, it is preferable that the threshold value be determined based on a relationship between secondary batteries each of whose measurement of how much the negative electrode active material layer covers the positive electrode active material layer is known and the battery voltage increase detected in the step D for each of the secondary batteries. In addition, the method may further comprise a step (step F) of estimating a measurement of how much the negative electrode active material layer covers the positive electrode active material layer of the secondary battery, based on the battery voltage increase detected in the step D.

Hereinabove, various examples of the method of testing a secondary battery according to one embodiment of the present invention has been described. However, the method of testing a secondary battery according to the invention is not limited to any of the foregoing embodiments unless otherwise stated.

REFERENCE SIGNS LIST

100—Lithium-ion secondary battery
200—Wound electrode assembly

220—Positive electrode (positive electrode sheet)
221—Positive electrode current collector
222—Uncoated portion
223—Positive electrode active material layer
224—Intermediate portion
225—Gap (void)
240—Negative electrode (negative electrode sheet)
241—Negative electrode current collector
242—Uncoated portion
243—Negative electrode active material layer
245—Gap (void)
252, 254—Side ends of wound electrode assembly
262, 264—Separator
280—Electrolyte solution
290—Charger
300, 300A—Battery case
310, 312—Gap between wound electrode assembly 200 and battery case 300
322—Joint portion between lid and case main body
340—Lid
350—Filling port
352—Sealing cap
360—Safety vent
420—Electrode terminal
420a—Foremost end portion
440—Electrode terminal
440a—Foremost end portion
610—Positive electrode active material particle
620—Conductive agent
630—Binder
710—Negative electrode active material particle
730—Binder
WL—Winding axis

The invention claimed is:

1. A method of testing a secondary battery including:
a positive electrode current collector;
a positive electrode active material layer retained on the positive electrode current collector;
a negative electrode current collector; and
a negative electrode active material layer retained on the negative electrode current collector and disposed so as to oppose the positive electrode active material layer,
the negative electrode active material layer being wider than the positive electrode active material layer and disposed so as to cover the positive electrode active material layer, the method comprising:
step A of charging the secondary battery to a predetermined charge voltage;
step B of setting aside the secondary battery for a predetermined time after the step A;
step C of discharging the secondary battery to a predetermined discharge voltage after the step B; and
step D of detecting a battery voltage increase for a preset time after a predetermined time has elapsed after the step C.

2. The method according to claim 1, wherein the charging in the step A is performed by CCCV charging.

3. The method according to claim 1, wherein the charge voltage in the step A is set to a voltage 10% or more higher than a lower limit voltage of a predetermined use range of the secondary battery.

4. The method according to claim 1, wherein the charge voltage in the step A is set to be equal to or higher than a voltage 10% lower than an upper limit voltage of a predetermined use range of the secondary battery.

5. The method according to claim 1, wherein the discharging in the step C is performed by CC discharging.

6. The method according to claim 1, wherein the discharge voltage in the step C is set to a voltage 5% or more lower than the charge voltage in the step A.

7. The method according to claim 1, wherein the discharge voltage in the step C is set to a voltage 5% or more higher than a lower limit voltage of a predetermined use range of the secondary battery.

8. The method according to claim 1, wherein the predetermined time in the step D is set to a time necessary to neutralize an electrochemical polarization associated with the discharging.

9. The method according to claim 1, wherein, in the step D, the battery voltage increase is detected for a preset time after at least 3 hours have elapsed after the step C.

10. The method according to claim 1, wherein, in the step D, the battery voltage increase is detected for at least 5 hours after the predetermined time has elapsed after the step C.

11. The method according to claim 1, wherein in the step B, the secondary battery is set aside for at least 24 hours.

12. The method according to claim 1, further comprising step E of performing a pass-or-fail determination about a measurement of how much the negative electrode active material layer of the secondary battery covers the positive electrode active material layer, by providing a threshold value of the battery voltage increase obtained in the step D.

13. The method according to claim 12, wherein, in the step E, the threshold value is determined based on a relationship between secondary batteries each of whose measurement of how much the negative electrode active material layer covers the positive electrode active material layer is known and the battery voltage increase detected in the step D for each of the secondary batteries.

14. The method according to claim 1, further comprising step F of estimating a measurement of how much the negative electrode active material layer covers the positive electrode active material layer of the secondary battery, based on the battery voltage increase detected in the step D.

15. The method according to claim 1, wherein:
the positive electrode current collector is in a strip shape and has a portion being devoid of the positive electrode active material layer, along one longitudinal side end thereof;
the positive electrode active material layer is formed on both faces of the positive electrode current collector except for the portion being devoid of the positive electrode active material layer;
the negative electrode current collector is in a strip shape and has a portion being devoid of the negative electrode active material layer, along one longitudinal side end thereof;
the negative electrode active material layer has a width wider than the positive electrode active material layer and is formed on both faces of the negative electrode current collector except for the portion being devoid of the negative electrode active material layer;
the positive electrode current collector and the negative electrode current collector are stacked and wound together with a separator interposed therebetween;
the separator has a strip shape having a width wider than that of the negative electrode active material layer;
the separator covers the negative electrode active material layer, and the negative active material layer covers the positive electrode active material layer with the separator interposed therebetween;
the portion of the positive electrode current collector being devoid of the positive electrode active material protrudes from one side end of the separator; and the portion of the negative electrode current collector being devoid of the negative electrode active material protrudes from the opposite side end to the one side end of the separator, the method further comprising:

step G of estimating a winding misalignment size of the positive electrode active material layer and the negative electrode active material layer of the secondary battery based on the battery voltage increase detected in the step D.

16. The method according to claim 15, further comprising:

step H of preparing secondary batteries each of whose winding misalignment size of the positive electrode active material layer and the negative electrode active material layer is known, and obtaining a relationship between the winding misalignment size of the positive electrode active material layer and the negative electrode active material layer and the battery voltage increase detected in the step D based on the prepared secondary batteries, and wherein in the step G, for a secondary battery whose winding misalignment size is unknown, the winding misalignment size of the positive electrode active material layer and the negative electrode active material layer of the secondary battery is estimated from the battery voltage increase detected in the step D, based on the relationship between the winding misalignment size and the battery voltage increase obtained in the step H.

17. The method according to claim 15, further comprising step I of performing a pass-or-fail determination about a winding misalignment size of the positive electrode active material layer and the negative electrode active material layer of the secondary battery, by providing a threshold value of the battery voltage increase obtained in the step D.

18. The method according to claim 15, wherein the secondary battery is a lithium-ion secondary battery.

19. The method according to claim 18, wherein the discharge voltage in the step C is set to lower than or equal to 3.1 V.

20. The method according to claim 19, wherein the charge voltage in the step A is set to be equal to or higher than a voltage 5% higher than the discharge voltage in the step C.

* * * * *